(12) United States Patent
Binder et al.

(10) Patent No.: US 10,320,153 B1
(45) Date of Patent: Jun. 11, 2019

(54) SYSTEMS AND METHODS OF AN L-SWITCHED LIGHT EMISSION

(71) Applicants: Rudolf Heinrich Binder, Tucson, AZ (US); Nai-Hang Kwong, Tucson, AZ (US); Paul Bryan Lundquist, Longmont, CO (US)

(72) Inventors: Rudolf Heinrich Binder, Tucson, AZ (US); Nai-Hang Kwong, Tucson, AZ (US); Paul Bryan Lundquist, Longmont, CO (US)

(*) Notice: Subject to any disclaimer, the term of this patent is extended or adjusted under 35 U.S.C. 154(b) by 0 days.

(21) Appl. No.: 14/714,248

(22) Filed: May 15, 2015

Related U.S. Application Data

(60) Provisional application No. 62/025,005, filed on Jul. 15, 2014.

(51) Int. Cl.
| | |
|---|---|
| *H01S 5/06* | (2006.01) |
| *H01S 5/343* | (2006.01) |
| *H01S 5/042* | (2006.01) |
| *H01S 5/062* | (2006.01) |
| *H01S 3/0941* | (2006.01) |
| *H01S 3/0933* | (2006.01) |
| *H01S 3/102* | (2006.01) |
| *H01S 3/11* | (2006.01) |

(52) U.S. Cl.
CPC ........ *H01S 5/34333* (2013.01); *H01S 3/0933* (2013.01); *H01S 3/0941* (2013.01); *H01S 3/1022* (2013.01); *H01S 3/11* (2013.01); *H01S 5/042* (2013.01); *H01S 5/062* (2013.01); *H01S 5/0614* (2013.01); *H01S 5/0615* (2013.01)

(58) Field of Classification Search
CPC ..... H01S 5/042; H01S 5/0614; H01S 5/18341
See application file for complete search history.

(56) References Cited

U.S. PATENT DOCUMENTS

| 5,081,633 A * | 1/1992 | Danner | B82Y 20/00 257/E33.008 |
|---|---|---|---|
| 2004/0197070 A1* | 10/2004 | Takemoto | B82Y 20/00 385/147 |
| 2010/0290217 A1* | 11/2010 | Anantram | B82Y 20/00 362/159 |
| 2011/0079767 A1* | 4/2011 | Senes | B82Y 10/00 257/13 |
| 2016/0380405 A1* | 12/2016 | Takiguchi | H01S 5/12 372/26 |

(Continued)

OTHER PUBLICATIONS

Yamanishi et al. ("Quantum mechanical size effect modulation light sources—a new field effect semiconductor laser or light emitting device", Jap. Jour. Applied Phys., vol. 22, No. 1, Jan. 1983, pp. L22-L24).*

(Continued)

*Primary Examiner* — Tod T Van Roy
(74) *Attorney, Agent, or Firm* — Furman IP Law

(57) ABSTRACT

Provided herein are systems and methods for switching the generation of light emissions using charge separation in a gain medium to manipulate carrier lifetimes. For a given output pulse energy, extended carrier lifetimes may allow carrier generation powers to be reduced and/or carrier generation times to be extended. L-switching of light output from a gain medium may be combined with other switching schemes utilizing different approaches to control lasing, such as Q-switching.

14 Claims, 29 Drawing Sheets

(56) References Cited

U.S. PATENT DOCUMENTS

2017/0263736 A1* 9/2017 Kim .................... H01L 33/0004

OTHER PUBLICATIONS

Takeoka et al. ("A 140ps optical pulse generation by field-induced gain switching in a photo-excited quantum well laser", Jap. J. Applied Phys., vol. 26, No. 2, Feb. 1987, pp. L117-L119.*
Suemune et al., "Gain-Switching Characteristics and Fast Transient Response of Three-Terminal Size-Effect Modulation Laser," IEEE Journal of Quantum Electronics, vol. QE-22, No. 9, Sep. 1986.

* cited by examiner

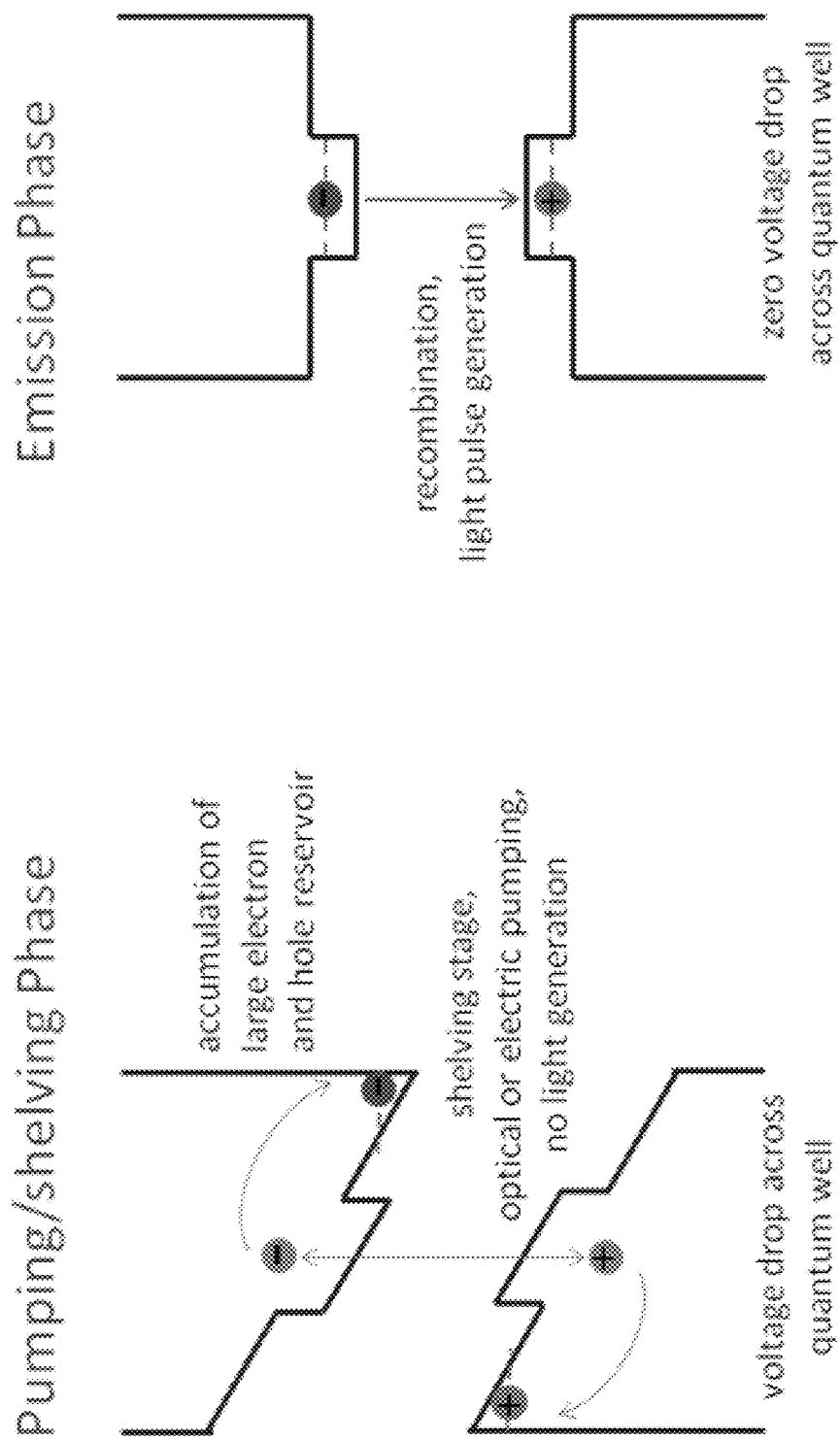

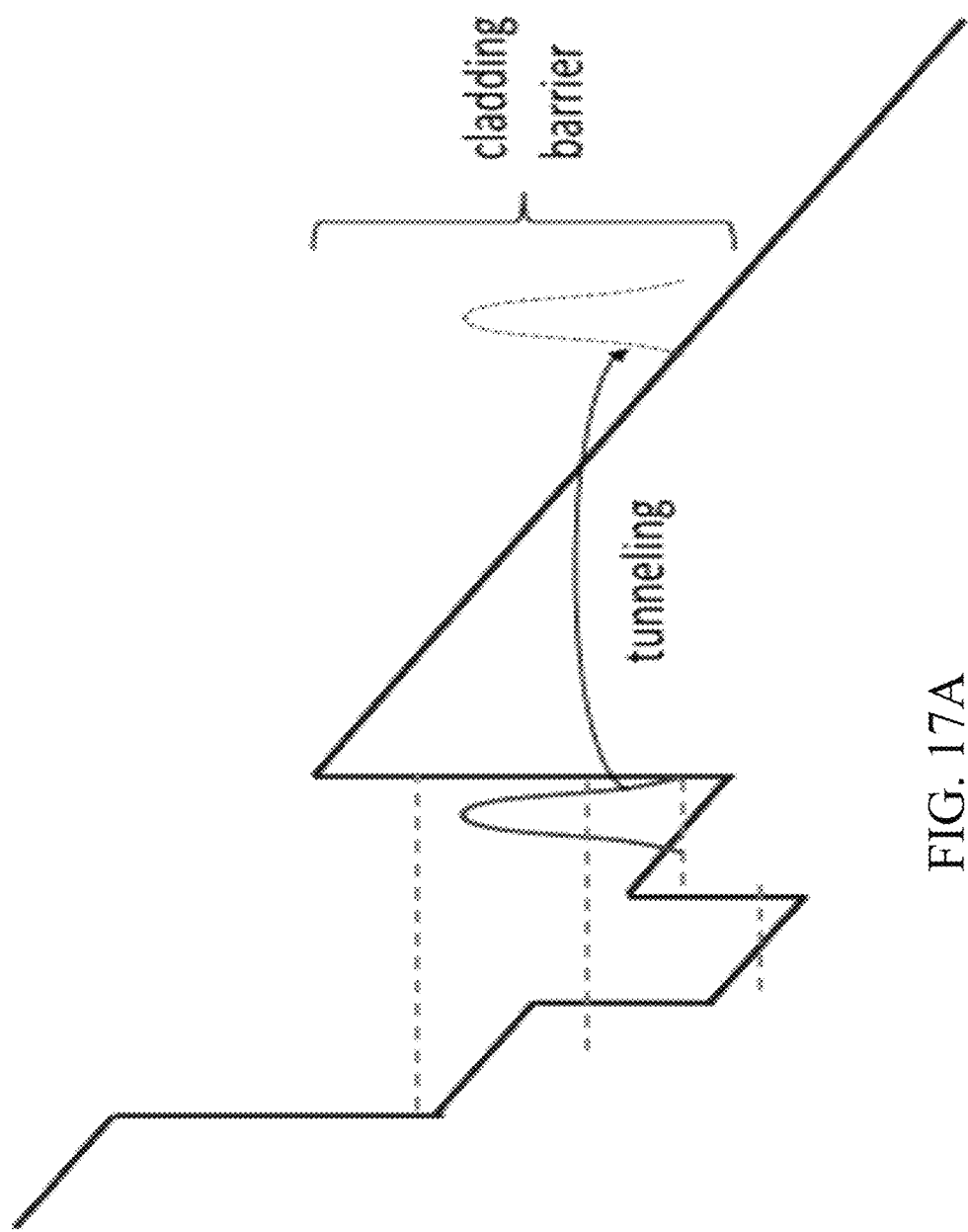

ca. 50% for μs dump time

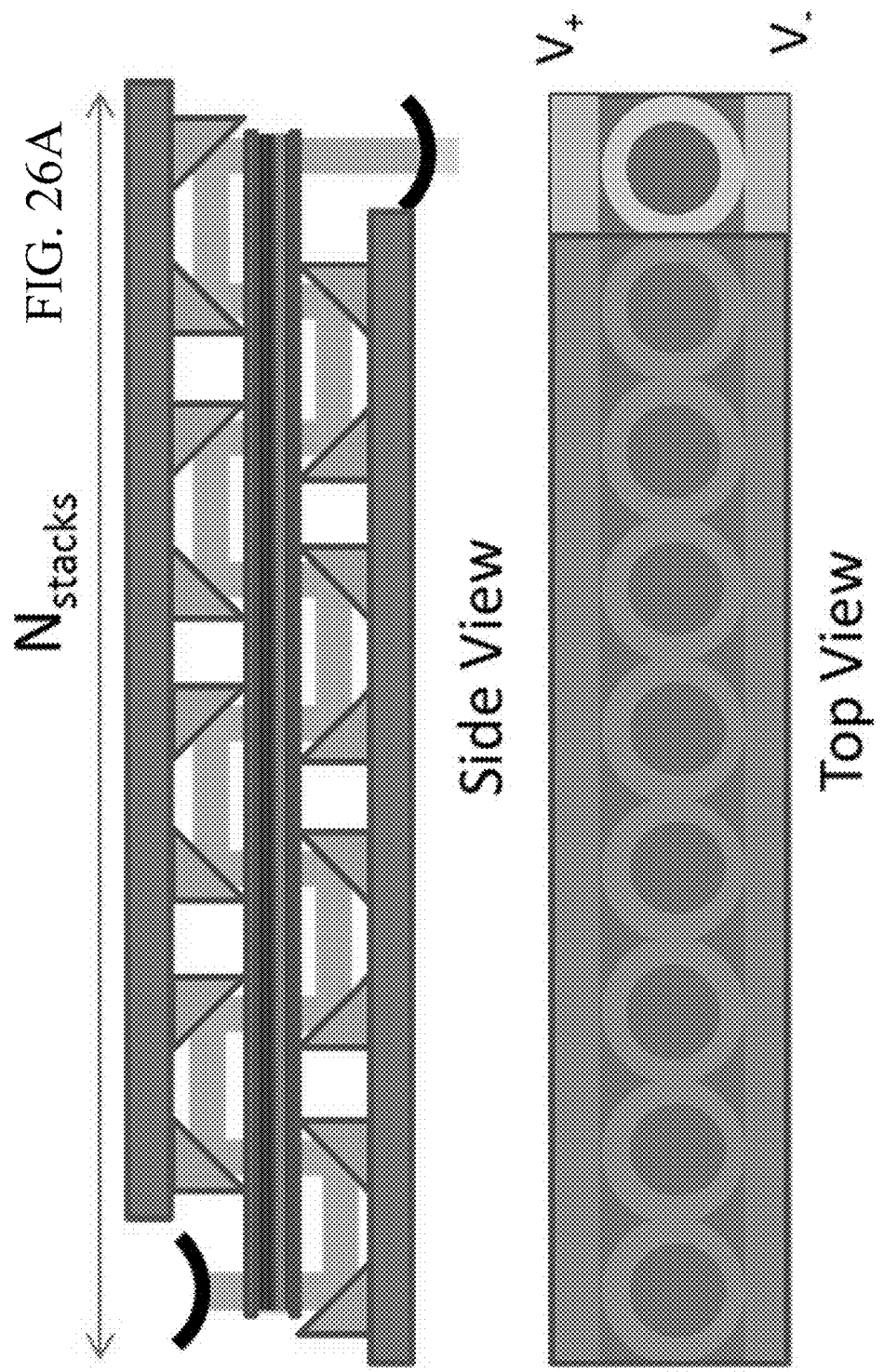

SYSTEMS AND METHODS OF AN L-SWITCHED LIGHT EMISSION

RELATED APPLICATIONS

The application claims priority to U.S. Provisional Patent Application Ser. No. 62/025,005, entitled "SYSTEMS AND METHODS FOR AN L-SWITCHED LIGHT EMISSION," and filed Jul. 15, 2014, the disclosure of which is hereby incorporated by reference in its entirety for all purposes.

STATEMENT OF GOVERNMENT SPONSORSHIP

This invention was made with government support under contract # N00014-13-P-1173 awarded by the Office of Naval Research. The government has certain rights in the invention.

FIELD OF THE TECHNOLOGY

Embodiments of this disclosure relate to optical gain structures with modified carrier lifetimes created via using an arrangement of quantum structures and a newly-introduced L-switching scheme utilizing an electrical field across the quantum structures.

SUMMARY OF THE DESCRIPTION

Provided herein are systems and methods for switching the generation of light emissions using charge separation in a gain medium to manipulate carrier lifetimes. For a given output pulse energy, extended carrier lifetimes may allow carrier generation powers to be reduced and/or carrier generation times to be extended. L-switching of light output from a gain medium may be combined with other switching schemes utilizing different approaches to control lasing, such as Q-switching.

In one aspect, the disclosure describes a light emitter comprising an optical gain structure including a confinement region for charge carriers. The light emitter further comprises a plurality of electrodes configured to provide an electric field across the region and produce an electric field within the region while the electrodes maintain a first bias voltage. The light emitter further includes a pumping source configured to populate charge carriers into a barrier region of the quantum confined structure. The light emitter further includes control circuitry for switching the electric field via changing the first bias voltage to a second bias voltage and thereby inducing recombination of the charge carriers in the gain structure.

The light emitter may be further configured within an optical cavity to produce a laser.

Other embodiments and features of the present disclosure will be apparent from the accompanying drawings and from the detailed description which follows.

BRIEF DESCRIPTION OF THE DRAWINGS

The following patent description and drawings are illustrative and are not to be construed as limiting.

FIG. 2 shows a band diagram during a pumping/shelving phase of an exemplary embodiment of an L-Switched light emission.

FIG. 3 shows a band diagram during an emission phase of an exemplary embodiment of an L-Switched light emission.

FIG. 17A shows a band diagram schematic of carrier leakage due to tunneling in an exemplary structure.

FIG. 26A shows an exemplary embodiment of a structure with multiple gain elements within a cavity from a side view.

FIG. 26B shows an exemplary embodiment of a structure with multiple gain elements within a cavity from a top view.

DESCRIPTION

Figure 1:
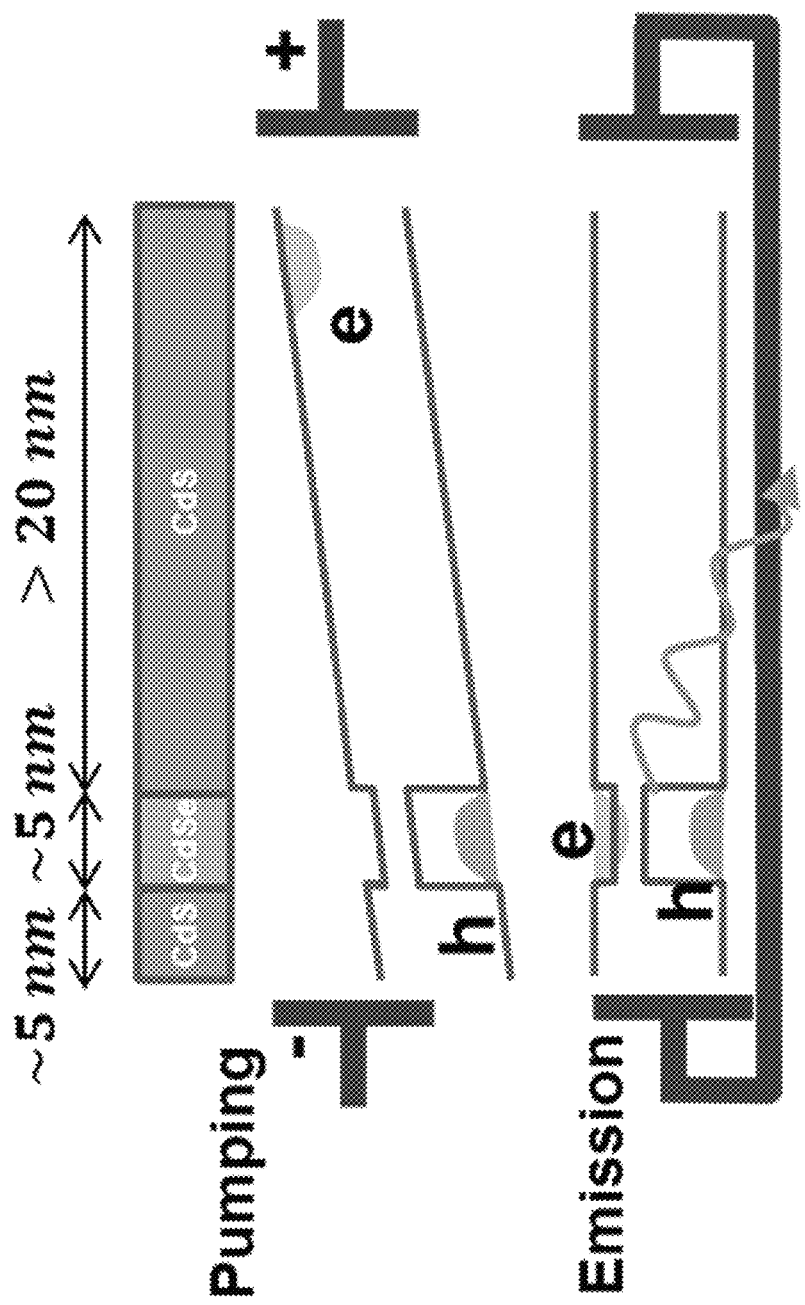
FIG. 1 shows an exemplary embodiment of a structure and related band diagram of pumping/emission scheme for producing an L-Switched light emission as provided for herein.

The following patent description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one. Reference in this specification to "one embodiment" or "an embodiment" or the like means that a particular feature, structure, or characteristic described in connection with the embodiment is included in at least one embodiment of the disclosure. The appearances of the phrase "in one embodiment" or the like in various places in the specification are not necessarily all referring to the same embodiment, nor are separate or alternative embodiments mutually exclusive of other embodiments. Moreover, various features are described that may be exhibited by some embodiments and not by others.

Described herein is a pulsed semiconductor light emission device that can be pumped over much longer durations than the emission time via manipulating the energetic fields within the device. This capability minimizes pumping power constraints for a given output peak power by allowing for longer pumping times to be used for a given pumping energy input.

Q-switched diode-pumped solid state laser architectures are presently the primary means for generating high peak power pulsed laser sources. These solid state lasers operate by allowing the pumping phase to occur over much longer durations than the optical emission phase. The energy stored within the solid state crystal's upper energy states is built during a long pumping time, allowing for high peak powers to be produced during emission. However, most solid state lasers crystals only lase efficiently within a few wavelengths of the energy bands defined by the solid state crystal materials.

In contrast, semiconductor quantum well light emitters can be created with quantum-confined structures designed to produce emissions over very broad wavelength bands, from UV to the infrared. For example, the properties of a quantum well determines the lowest energy states that electrons (and holes) can have therein and, thus, the emission wavelengths produced when the carriers in the device recombine. Consequently, designed emission wavelengths are achieved via adjusting properties such as quantum well material and the quantum well thickness. Similar emission wavelength selection is also possible in quantum rod geometric designs.

However, semiconductor lasers are not used for high peak power because the carrier recombination lifetimes in semiconductor gain media are naturally very short. In other words, without intervention via the methods and structures described herein, emissions occur in semiconductor gain media at nearly the same rate as pumping can occur, and therefore, there is no substantial energy storage possible within the crystal and high peak power switched laser emission operation is impossible.

The systems and methods described herein use semiconductors directly to produce high peak power through nanoscale energy storage using quantum structures and manipulated energy bands therein. These systems and methods allow pumping (e.g., via optical pumping, via heterojunction carrier injection) to occur more slowly. This reduces the impact of various constraints including heat production, cooling, pumping power needed in light emitting systems, particularly in compact laser systems with multiple such constraints. At the transition between pumping phase and emission phase, as internal fields are released, carriers in the device need only move several nanometers to recombine. Therefore, in addition to the benefits of increased pumping time, in certain embodiments, negligible heat is produced during the carrier migration necessary to recombine.

The systems and methods described herein may use electrodes and structural spacings to enable large electric field modulation to be produced across the nanoscale and/or quantum structures described herein. In configurations using optical pumping, cladding layers may be used in the device to mitigate or prohibit carrier transport out of the device.

In one embodiment, the device utilizes an externally applied electric field to modulate electron and hole recombination rates. During pumping, electric fields separate electrons and holes so that their probability of recombination is very low. Electric fields may be placed across the entire device and electric fields on a nanoscale may be modified by carrier population differences, e.g., across the distances of nanoscale structures in the device.

In some embodiments, quantum-confined structures may be embedded within heterojunctions such as p-n junctions. Stacked devices may be constructed, including cladded quantum-confined structures separated by interdigitized electrodes.

During the pumping phase of operation, carriers (e.g., electrons and holes) are stored in the modified band structures of the nanoscale structures. The electric field in the device is modified abruptly to quickly shift the recombination rates of the carriers and create a pulsed optical emission. The modification of the electric field brings electrons and holes out of the barrier regions and into one or more quantum-confined volumes where recombination of the carriers occurs at high probability and thus leading to a pulsed emission of light at the designed wavelength. The recombination rates resulting in such a pulsed system can result in a gain exceeding the cavity lasing threshold, resulting in pulses with high peak power pulses.

Such a system of operation is termed herein an L-switching switching scheme with reference to the recombination lifetime of carriers within the device. This name invokes the terminology of an actively Q-switched laser, only in an L-switching scheme the emission/recombination lifetime of the carriers is modulated instead of the cavity Q being modulated to create the output pulse.

The two switching schemes, L-switching and Q-switching, may also be combined into a hybrid LQ-switching scheme. During the electrical modulation of the device, the emission spectrum will change, so intra-cavity insertion of a spectral filter can also be used to induce Q-switching behavior into the cavity at the same time. Thereby two different mechanisms may be employed to hold off lasing within the laser cavity. Thus such a hybrid system of operation is termed herein as an LQ-switching switching scheme.

Devices containing nanostructures for containing and delaying recombination of carriers may be constructed from one or more quantum wells within barriers and claddings surrounded by electrodes. They may also be constructed from aligned "forests" of quantum rods.

In order to create large externally-applied electric fields, material layers of the laser device surrounding the quantum-confined structures (e.g., in a VCSL or VECSEL) may be used to provide potential differences across the barrier layers and the quantum well layers. The material and geometric construction choices should allow the fields to hold the carriers within barrier layers without significant penetration into cladding layers.

Devices may be electrically or optically pumped. In an electrically pumped system, n-doped and p-doped cladding material may be used to inject charge into barrier regions for storage during pumping and prior to an optical emission phase. Optical pumping schemes may include directing of optical pumping radiation along a direction substantially aligned with the electric field provided for L-switching. For a VECSEL or VCSL configuration, the optical pumping source may be external to the semiconductor device.

Alternatively, optical pumping radiation may be provided in a direction substantially orthogonal to the optical emission direction. For VECSEL or VCSL configurations, optically pumping radiation may be provided by diodes fabricated on the same substrate as the switched semiconductor laser.

Details of Exemplary Embodiments

The presented invention provides a significant improvement, by enabling high peak power emissions to be generated directly from semiconductors at designed wavelengths selectable over very large bandwidths. The technology is expected to be an enabler for wavelength specific detection or material processing applications. High peak powers improve efficiency in nonlinear processes and detection ranges. For lidar applications, short pulses provide range resolution. Wavelengths can be chosen to match specific transmission, absorption, or scattering peaks of material constituents.

Technical Approach

Diode lasers have advanced tremendously, with electrical to optical efficiencies exceeding 70% in some cases. The availability of high efficiency diodes combined with long lifetime rare-earth crystals have made Q-switched high-peak-power diode pumped solid state lasers the standard technology for many applications. For frequency doubled Q-switched Nd:YAG lasers all the laser power comes through the diode sources. Currently, diodes themselves are not capable of achieving high peak powers due to their extremely limited energy storage capability, with excited lifetimes typically limited to 100's of picoseconds. Consequently, even with highly efficient diodes used for pumping, the overall efficiencies of these systems are relatively low (~5-10%). Alternatively, a high-efficiency, high-peak-power diode laser would circumvent the complexities and inefficiencies associated with optical pumping solid state crystals and with nonlinear frequency conversion.

We have developed a concept for using an external electric field in conjunction with geometric designs to actively manage the emission lifetime.

FIG. 1 shows an exemplary embodiment of a structure and related band diagram of pumping/emission scheme for producing an L-Switched light emission as provided for herein. An electric field is sufficient to separate an electron and hole and suppress recombination during pumping. To enable lasing, the electric field is removed.

In a first example of possible embodiments of our concept we considered core/shell nanorods where an external electric field was sufficient to "ionize" an electron from an exciton in the core component of the nanorod. FIG. 1 illustrates the concept for a CdSe/CdS core shell nanorod. During this ionization stage, the electron is stored in the shell portion of the rod, and the recombination rate is vastly reduced. During the "ionized" stage, the hole may still be confined within the core, or it may also be "ionized" and mostly residing on the opposite of side of the shell where the electron is residing. When the electric field is released, the electron returns to the core, recombines with the hole, and a photon is emitted. The system has a long lifetime when the charges are separated and a short lifetime when the charges are confined within the core layer.

Though the previous example was illustrated for nanorod nanostructures, the same active control is also applicable to the excitonic lifetime of layered quantum well nanostructures where confinement is implemented in only one dimension. These structures allow for higher exciton densities and are more readily fabricated with mature processes.

This active switching of the lifetime of a gain medium within a cavity leads to effects that are very similar to Q-switching in that energy stored within the gain material is rapidly made available for lasing, so that the gain exceeds that cavity losses and a "giant pulse" is emitted. However, the switching is made through voltage modulation of the gain material itself instead of a separate electro-optic crystal. We are calling this effect "L-switching", where the "L" stands for lifetime. Since a significant Stark-shift in the gain curve of the semiconductor accompanies the electrical switching, a spectral filter may be added to the cavity to include modulation of cavity losses as well, producing combined QL-switching effects.

In the simple form of the device the application of the external field results in separation of the electron and hole. However, we have also explored a device concept in which the quantum well is embedded within a p-n junction. In this case the built-in electric field at the junction can be used to separate the electrons and holes. With the p-n junction based device, the external field is applied to flatten the field across the quantum well and allow for recombination. The p-n junction may also be used to inject current into the well, allowing for electrical pumping.

Optical pumping is not an unattractive approach for the described emitters. Since optical pumping can be performed at wavelengths near the emitting wavelength, diode pump emitters can be fabricated within the same chip as the L-switched emitter in an integrated monolithic component. The overall component would still be electrically driven.

We have explored the use of II-VI and III-V material systems for fabrication of blue/green emitting devices. It is worth mentioning that for many applications, where infrared emission is desired, our switching process also has merit. For these applications much more mature device fabrication processes are available based on GaAs materials.

Lifetime Switching (L-Switching) of a Quantum Well

FIGS. 2 and 3 illustrate a simple scheme implementing L-switching in a quantum well/barrier nanostructure. FIGS. 2 and 3 show a band diagram during a pumping/shelving phase and during an emission phase for an exemplary embodiment of an L-Switched light emission. Shown are the conduction-band and valence-band potential profiles along the growth direction of a quantum well/barrier structure. During the shelving phase an electric field is applied across the structure, spatially separating the electrons from the holes, which leads to a suppression of recombination and hence a large excited population. During the emission phase in FIG. 3, the electric field is turned off, returning the electron-hole luminescence rate to its normal value. The shelved excitations are dumped as a strong light pulse.

During the shelving phase in FIG. 2, an electric field is applied across the structure. During the shelving phase or part thereof, the system will be pumped. The system's band structure is designed in such a way that, under the electric field, the lowest energy quantum state of the electrons (holes) in the conduction (valence) band is localized at one end of the barrier, as shown in FIG. 2. The excited electrons and holes are thus separated from each other in space, leading to a drastic suppression of both radiative and non-radiative recombination rates. Under this condition, a large pumped electron-hole population accumulates over time, and pumping may occur through optical stimulation or through current injection. Switching off the electric field starts the emission phase as shown in FIG. 3. The lowest energy states move back to inside the quantum well, their wavefunctions overlapping each other spatially. The radiative recombination rate returns to its normal value, resulting in the dumping of the shelved excitation energy as a strong light pulse.

This process can be viewed as a nanoscale capacitive storage of charge for trigger-able pulsed power photonic emission. We can compare this approach to pulsed operation of conventional diodes where energy is stored in external capacitors prior to providing pulsed injection-currents. Our approach capacitively stores the charge, as close as quantum-mechanically allowed, prior to injection into the quantum well. Since the charge migrates over nanometer-scale distances during emission, the resulting generation of heat is negligible when compared to diodes where similar currents are applied over macroscopic distances.

Figures 4, 5:
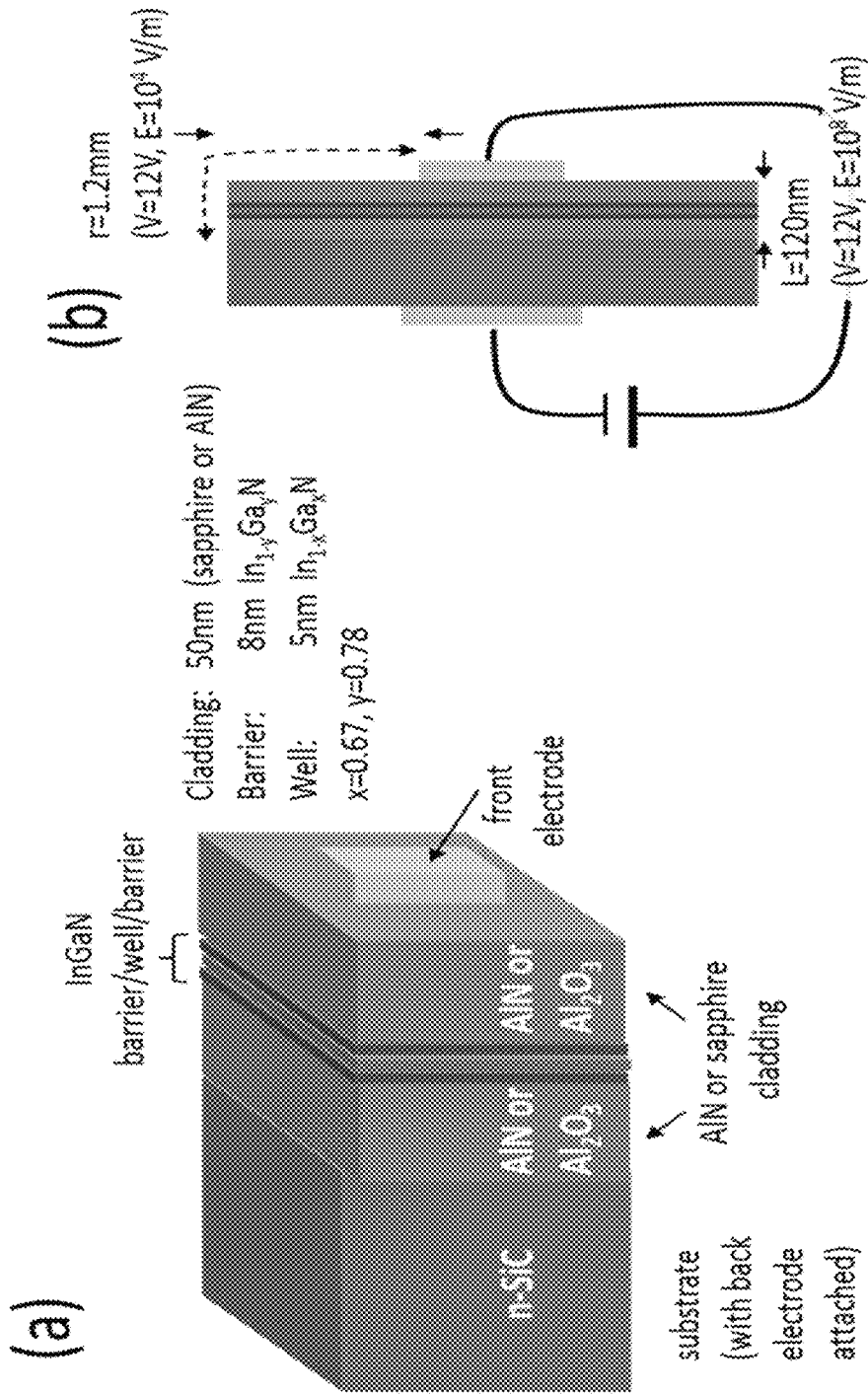
FIG. 4 shows an exemplary embodiment of a structure for producing an L-Switched light emission.
FIG. 5 shows further details of an exemplary embodiment of a structure for producing an L-Switched light emission.

FIGS. 4 and 5 show an exemplary embodiment for producing an L-switched light emission that is suitable for use with optical pumping of the structure, including exemplary values for the geometric length scales, voltages, and electric fields. The example is designed to avoid electrical break down through fringe fields around the structure by making the vertical dimension much larger (shown here as 1.2 mm) compared to the horizontal dimension (shown here as 120 nm).

L-Switching in a Quantum Well Using a p-n Junction

Though the approach described in FIGS. 2 and 3 can be achieved with moderate voltages, very large electric fields are required. This is mainly because the applied field has to be large enough so that the Coulomb attraction between the separated electrons and holes cannot dominate over the external field that is trying to separate the charges.

Figure 6:
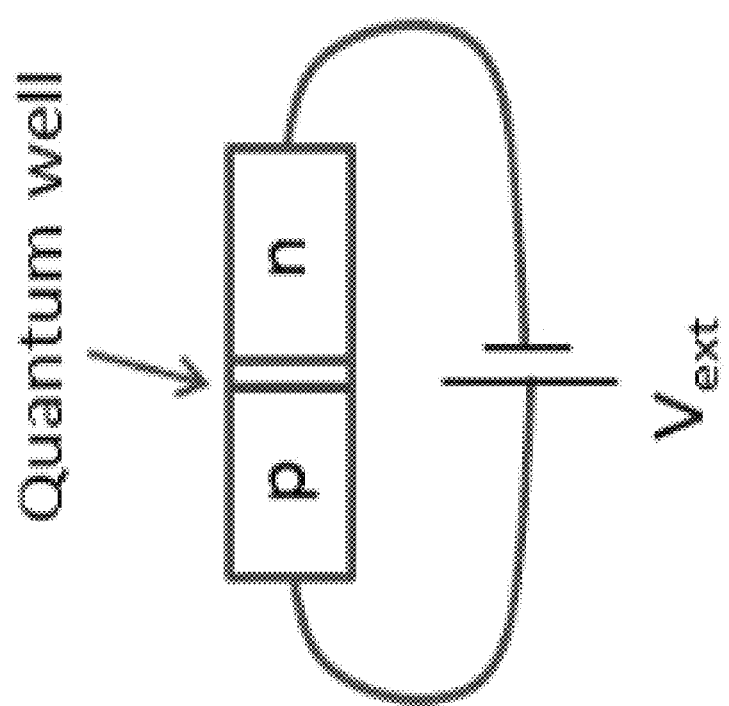
FIG. 6 shows an exemplary block diagram of a quantum well/p-n junction structure for producing an L-Switched light emission.
Figure 7:
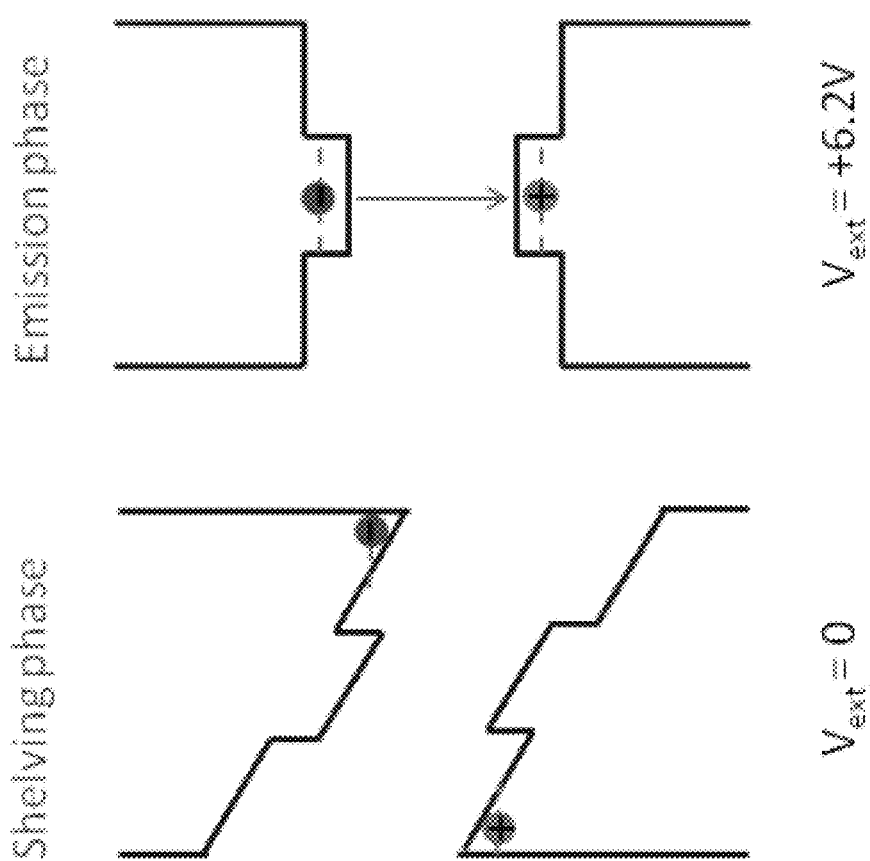
FIG. 7A shows an exemplary band diagram of a quantum well/p-n junction structure during a shelving phase.
FIG. 7B shows an exemplary band diagram of a quantum well/p-n junction structure during an emission phase.

We investigated a variation of the approach shown in FIGS. 4 and 5, in which a p-n junction is used to provide the electric field. The concept of this alternative scheme is sketched in FIGS. 6 and 7. FIG. 6 shows an exemplary block diagram of a quantum well/p-n junction structure for producing an L-Switched light emission. FIGS. 7A and 7B show an exemplary band diagram of a quantum well/p-n junction structure during a shelving phase and an emission phase.

The quantum well/barrier structure is embedded in the immediate neighborhood of the p-n interface in the depletion region on the p-doped side of a p-n junction of FIG. 6, as designated with the arrow. The switching is again effected by the external bias potential, but, in contrast to the simple scheme in FIGS. 2 and 3, the external field is off during the shelving phase and is turned on during the emission phase.

The equilibrium charge distribution in the depletion region provides the needed potential drop across the quantum well/barrier to separate the electrons and the holes (FIG. 7A). During the emission phase one turns on the external bias potential, which offsets the 'intrinsic' electric field in the depletion region (FIG. 7B). The quantum well/barrier being thus returned to a 'flat-band' configuration, the excited electrons and holes move to overlap each other, resulting in efficient light emission. The advantage of this scheme is that the two doped segments of the junction act as a micron-scale capacitor, the potential drop of which can conveniently be tuned by the low external bias potential. This enables the design to sidestep the challenge of inserting a pair of electrodes at the two ends of the nano-scale quantum well/barrier structure.

Proposed Design of AlN/InGaN L-Switched Light-Emitting Structure

We have produced a design implementing the L-switching concept sketched in FIGS. 6 and 7. The materials we have selected are doped MN for the p-n junction and InGaN for the quantum well and barriers. We summarize the considerations leading to this choice in the next subsection. One main design consideration of the nanostructure is its energy band profile, especially the band offsets at various interfaces. The band profile depends on two factors: the material composition in each layer and the charges accumulated in the junction's depletion region.

Figure 8:
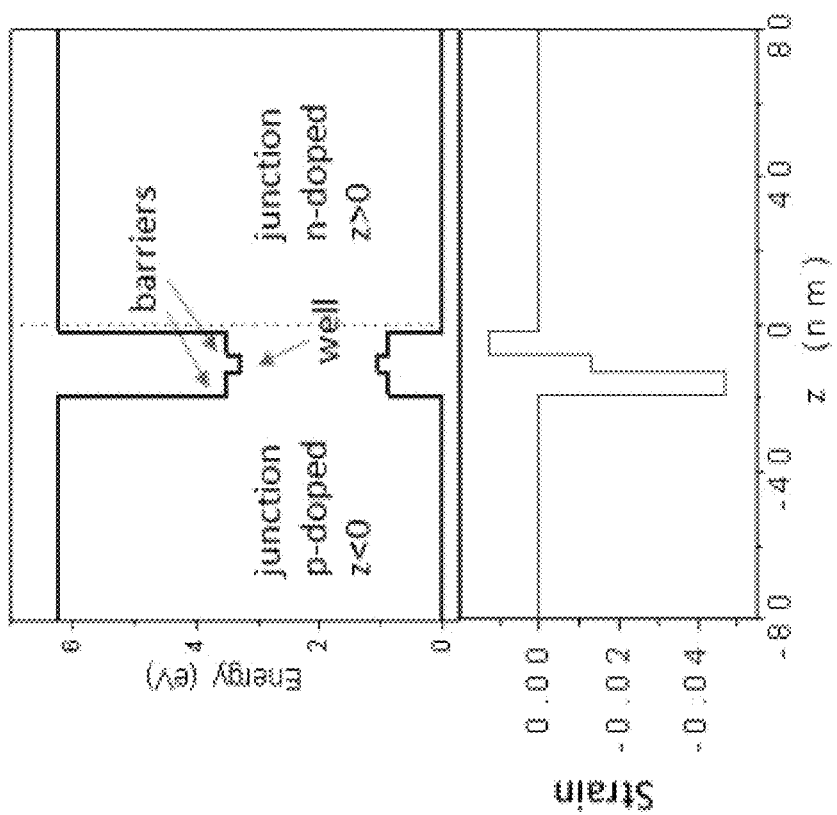
FIG. 8 shows a comparison across an exemplary quantum well/barrier structure of band diagrams and strain profile of the structure.

FIG. 8 shows a comparison across an exemplary quantum well/p-n junction structure of band diagrams and strain profile of the structure. FIG. 8 shows our structure's band diagram before the formation of the depletion region at the junction, together with the material parameters used. For the growth orientation assumed here, no electric fields due to the spontaneous polarization of III-nitride materials or piezoelectric fields occur. For other growth directions, these inherent fields can be used to optimize the structure design with regard to the L-switching requirements. FIG. 8 also shows the strain profile.

Figure 9:
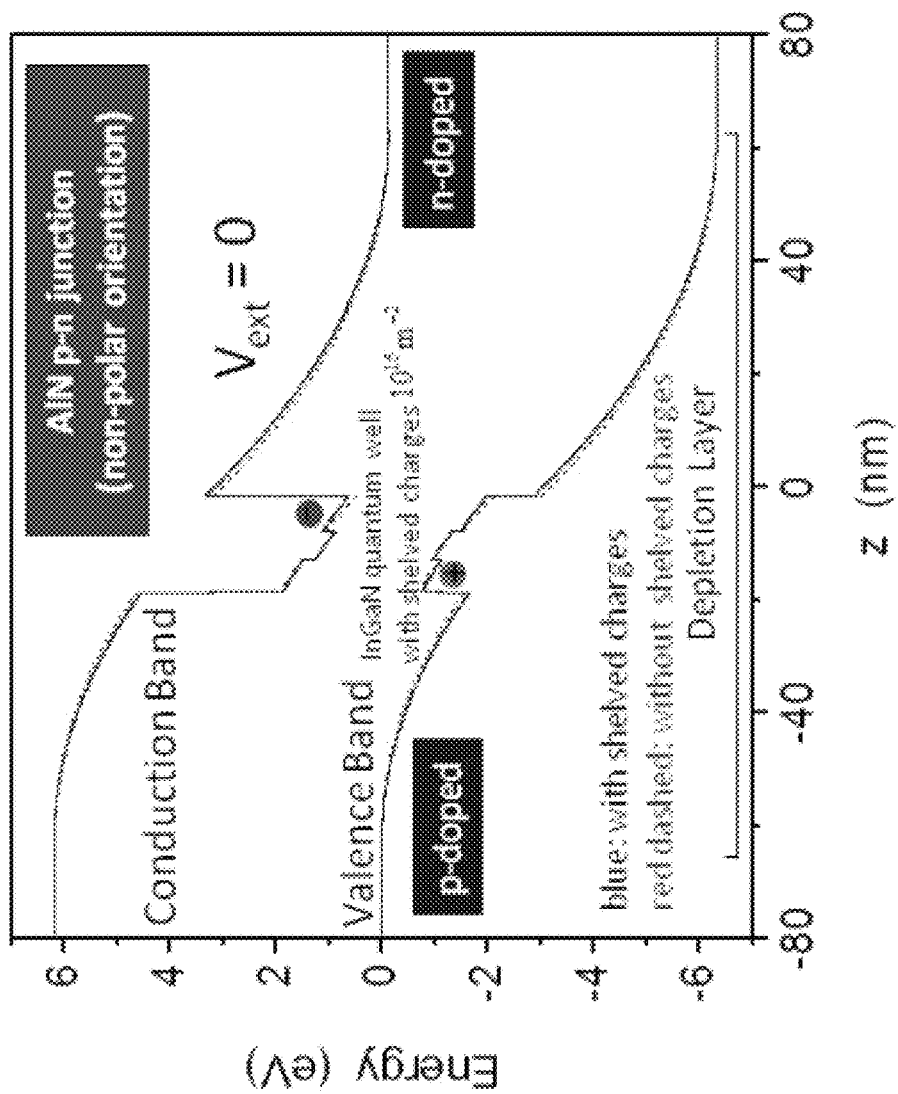
FIG. 9 shows an exemplary band diagram of a quantum well/p-n junction structure with the effect of charge distribution in the junction's depletion region.

FIG. 9 shows an exemplary band diagram of a quantum well/p-n junction structure with the effect of charge distribution in the junction's depletion region. The equilibrium charge distribution, resulting from charge diffusion between the two doped segments of the p-n junction and making up the depletion region, produces a potential gradient across the quantum well/barrier structure, as shown in FIG. 9 (dashed red line). The potential drop here (about $5 \times 10^7$ V/m) is generated by a doping density of $10^{-18}$ cm$^3$ on either side of the junction. Achieving this doping concentration is presently still challenging for III-nitride structures, while in conventional (red-emitting) III-V structures it can be routinely achieved.

Figure 11:
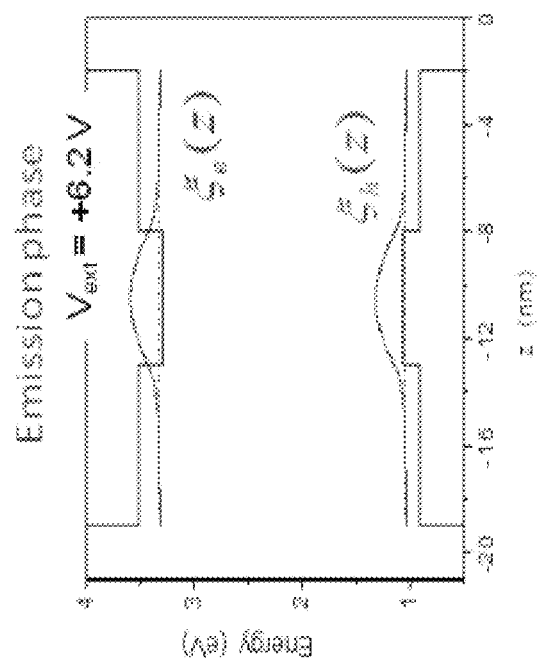
FIG. 11 shows exemplary wavefunctions within a quantum well/barrier structure during an emission phase.
Figure 10:
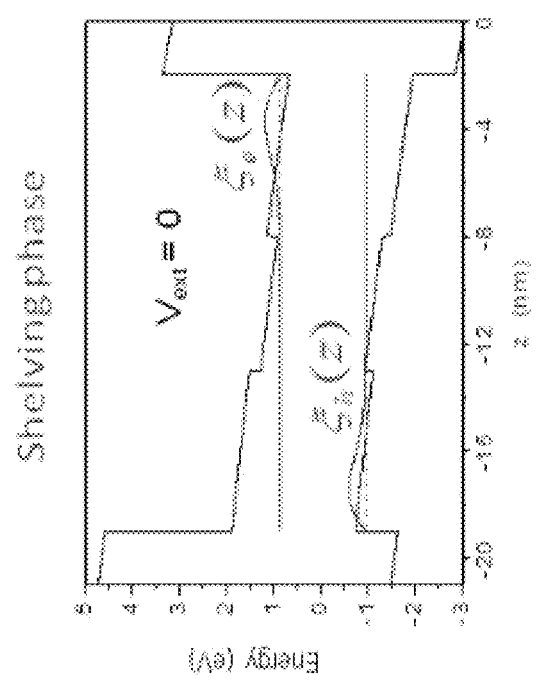
FIG. 10 shows exemplary wavefunctions within a quantum well/barrier structure during a shelving phase.

FIGS. 10 and 11 show exemplary wavefunctions within a quantum well/barrier structure during a shelving phase and an emission phase, respectively. As described in the previous subsection, the equilibrium potential gradient needs to be sufficiently strong to separate the pumped electrons and holes during the shelving phase. FIG. 10 shows that the calculated wavefunctions for these carriers are indeed well separated by the field generated by the depletion region charges. The separated charges, in turn, modify the electric field inside the quantum well/barrier. The energy band profile, taking into account the effect of a pumped charge density of $10^{12}$ cm$^{-2}$, which are approximated as two charged sheets, is shown as the solid blue line in FIG. 9. It can be seen that this modification is quite modest. During the emission phase FIG. 11, an external bias potential of 6.2 V is applied, which compensates for the potential drop across the junction, returning the bands to a 'flat' configuration, and leading to maximum overlap between the wavefunctions. The fact that the confinement region comprises two barriers and a well region is not of crucial importance. We have also analyzed structures similar to the one shown in FIGS. 10 and 11, but with the well depth reduced to zero, in other words without a well region in the middle of the confinement region, and found that those structures can also be used for L-switching.

The luminescence rate is proportional to the square of the absolute magnitude of the overlap between the electron and hole wavefunctions. From our wavefunctions, the shelving phase luminescence rate is calculated to be reduced by a factor of approximately $f_r = 10^{-10}$ relative to the emission phase rate, with $$f_r = \frac{|\langle \xi_e | \xi_h \rangle_{sp}|^2}{|\langle \xi_e | \xi_h \rangle_{ep}|^2}$$

where sp stands for shelving phase and ep for emission phase, and $\langle \xi_e | \xi_h \rangle = \int dz \xi_e^*(z) \xi_h(z)$.

Materials Selection Considerations

The material composition and dimensions of each layer in the structure shown in the previous example were selected to have the required optical and/or electronic properties and to be able to form interfaces with manageable strain and to provide green light emission. Green-light emitting L-switch structures can be made from II-VI and III-nitride materials. GaN based materials may be chosen because the exploitation of these materials is rapidly maturing and is already demonstrated in commercial blue-green emitting diodes and LEDs. Presently, disadvantages of III-nitride materials are related to the fact that it is difficult to grow high quality crystals (that exhibit long non-radiative lifetimes), especially in structures that involve built-in strain, and it is difficult to dope the structure such that, at room temperature, the free carrier concentration is close to or larger than $10^{17}$ cm$^{-3}$. It is also still difficult to grow II-VI materials emitting in the green that would not show degradation problems (i.e. diminishing crystal quality over time). For L-switching in optically pumped III-nitride structures, where doped crystal segments are not needed, possible choices for the cladding material include sapphire or AlN, which have bandgaps substantially larger than the green emission frequency and are therefore well-suited as cladding materials. The quality of the crystal structure of the cladding material is not as important as that of the barrier material, as the deleterious non-radiative recombination happens mostly in the barrier material. In the current embodiment, the dimensions of the quantum well/barrier were chosen to engineer wavefunctions for green light transition emissions and sufficient shelving-phase charge separation.

The concept of L-switching is also valid for III-V compounds emitting in the red or near infrared. A possible embodiment of an L-switching structure could be $In_xGa_{1-x}$As as well material (x to be chosen sufficiently large so that type-I band alignment at the $In_xGa_{1-x}As$—InP interfaces is ensured, but not too large so that the well is nearly lattice-matched to the barrier) and InP as barrier material. In the case of an optically pumped III-V L-switching structure, a possible cladding material with sufficiently large bandgap (substantially larger than that of InP) could be the spinel oxide $MgAl_2O_4$, which has a direct gap of approximately 5.36 eV. For a p-n junction embodiment of a III-V L-switching structure, p- and n-doped cladding materials might be chosen from the II-VI material system, for example CdS or $CdSe_yS_{1-y}$, latticed matched to InP.

The concept of L-switching is also valid for organic light-emitting diodes (involving organic p-n junctions) and light-emitting electrochemical cells. Charge carrier mobilities are generally smaller in organic materials compared to inorganic crystals. This may affect in particular the carrier capture process, described further herein, possibly leading to slower carrier capture and carrier recombination in the emission phase of the L-switching process, hence increasing the lower limit of the pulse duration in organic vs inorganic L-switching structures.

Non-Radiative Losses of Pumped Electron-Hole Populations

Figure 12:
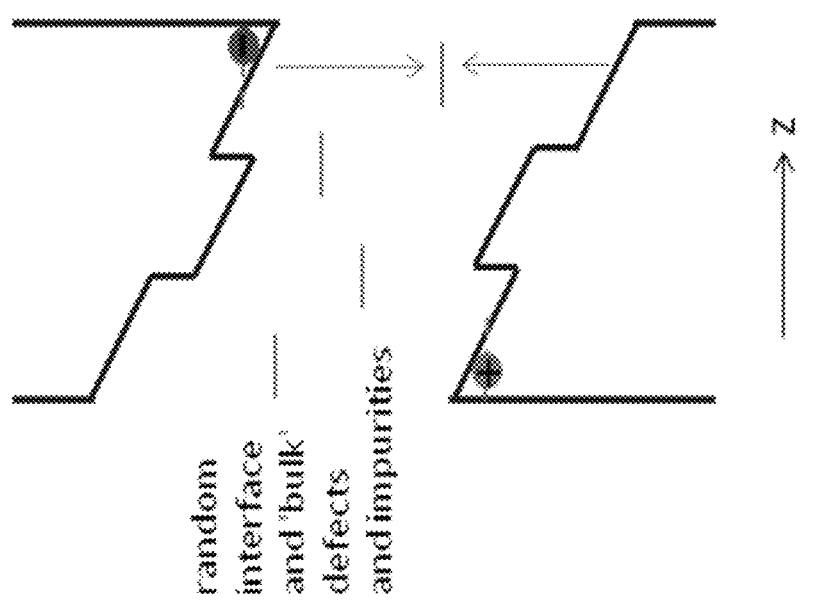
FIG. 12 shows an exemplary band diagram of a quantum well/barrier structure and non-radiative Shockley-Read-Hall (SRH) recombination processes therein.
Figure 13:
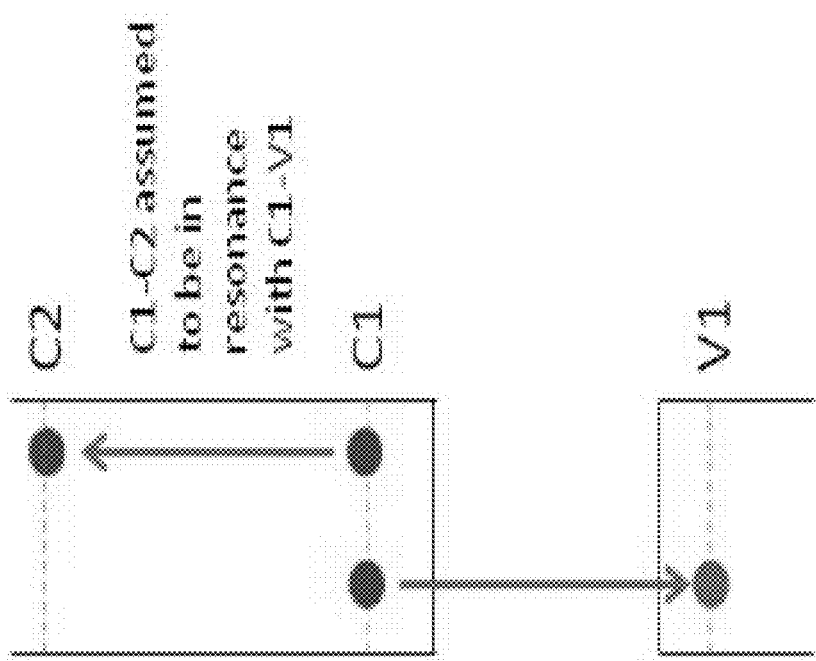
FIG. 13 shows an exemplary energy diagram showing Auger recombination processes therein.

To attain the goal of long-lifetime energy storage, our invention reduces the luminescence rate by separating the pumped charges in the quantum well. However, this goal may still be compromised by losses of excitations via non-radiative recombination processes. Major non-radiative losses are through (i) the Shockley-Read-Hall (SRH) process, where bulk and surface defects spatially trap the electrons and the holes which then recombine, dissipating the excitation energy as heat, and (ii) Auger recombination where an electron-hole pair recombines, transferring their excitation energy to another charge instead of releasing it as a photon. These two processes are illustrated in FIGS. 12 and 13. Our analysis shows that during the shelving phase, these non-radiative processes are also substantially suppressed by charge separation so that even in their presence, microsecond-scale lifetimes should be achievable.

FIG. 12 shows an exemplary band diagram of a quantum well/barrier structure and non-radiative Shockley-Read-Hall (SRH) recombination processes therein. In the SRH process, the recombination is facilitated by trapping of the charges by impurities. FIG. 13 shows an exemplary energy diagram showing Auger recombination processes therein. In the illustrated Auger process, an electron (in level C1) and a hole (in level V1) recombine, transferring their energy via Coulomb to another C1 electron, which is excited to level C2.

Figure 14:
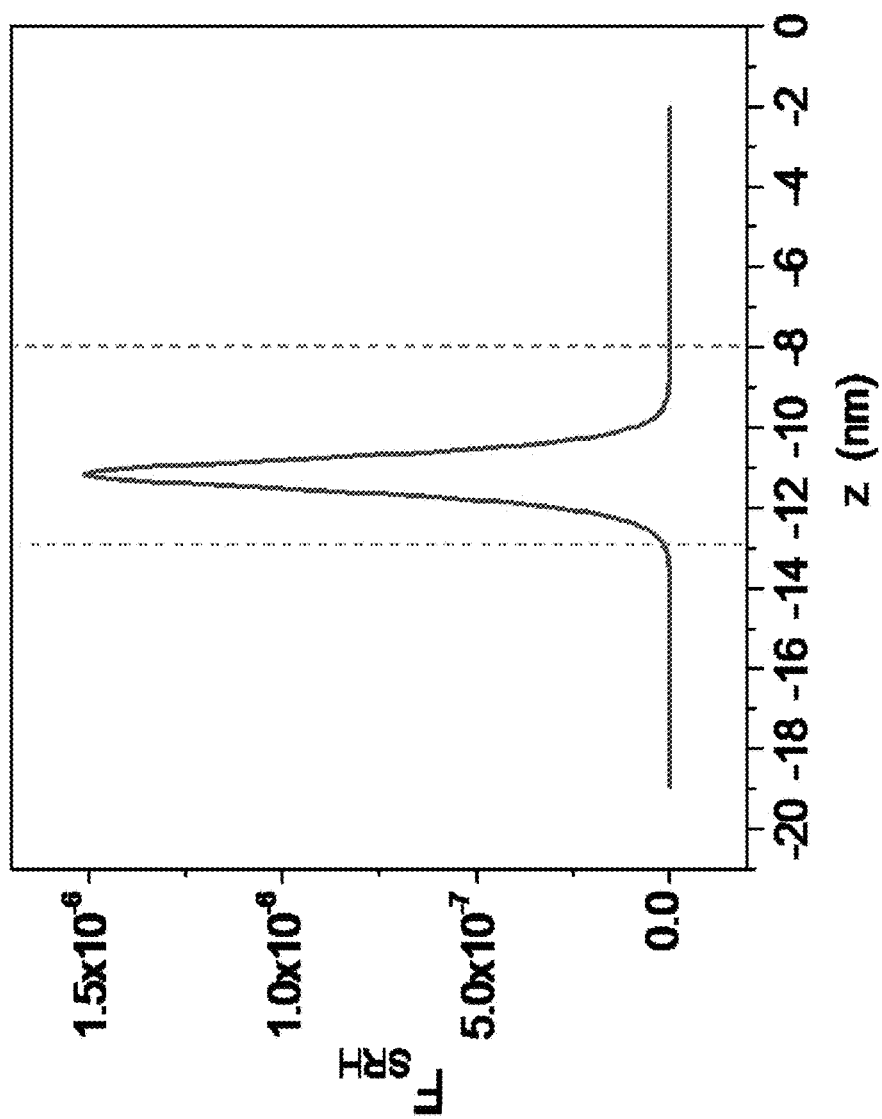
FIG. 14 shows an exemplary recombination factor for non-radiative Shockley-Read-Hall (SRH) recombination processes within a quantum well/barrier structure during the shelving phase.
Figure 15:
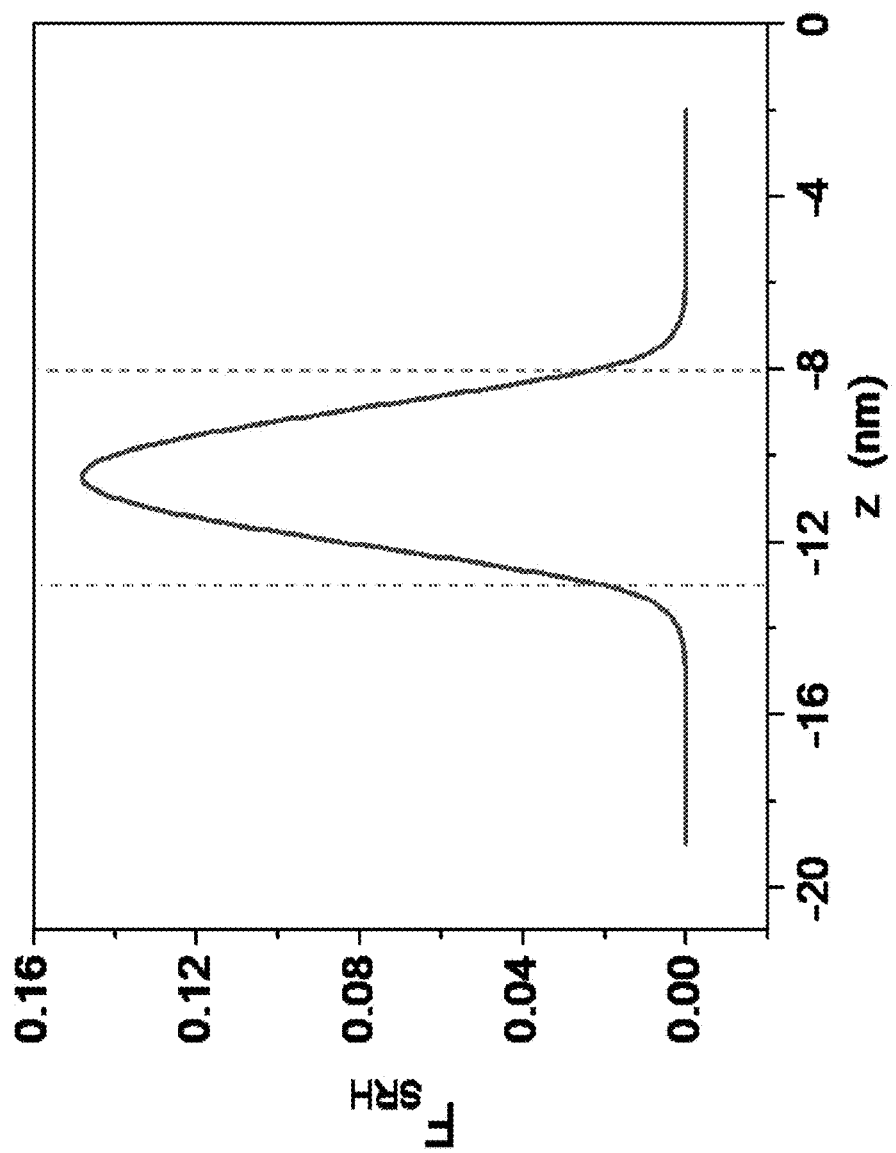
FIG. 15 shows an exemplary recombination factor for non-radiative SRH recombination processes within a quantum well/barrier structure during the emission phase.

FIGS. 14 and 15 show an exemplary recombination factor for non-radiative Shockley-Read-Hall (SRH) recombination processes within a quantum well/barrier structure during the shelving phase and the emission phase, respectively. The factor $F_{SRH}(z)$ is shown therein as a function of physical position during, respectively, the shelving phase and the emission phase. During the shelving phase shown in FIG. 14, the factor's peak value is reduced by at least a factor of $10^{-5}$ as compared to the emission phase shown in FIG. 15.

SRH Recombination

The trapping impurities responsible for the SRH process may reside in the 'bulk' of a layer or in an interface. The general theory of the SRH process gives the bulk recombination rate as $$w_{nr} \cong w_{nr}^{(0,bulk)} \frac{2}{L_z} \int dz F_{SRH}(z), \text{ where } F_{SRH}(z) = \frac{n_e(z)n_h(z)}{n_e(z) + n_h(z)},$$

$n_e(z)$ and $n_h(z)$ are the electron and hole densities respectively, $L_z$ is the total width of the quantum well/barrier structure, and $w_{nr}^{(0,bulk)}$ is a constant characteristic of the material and the impurity density. The interface SRH rate is similarly given by $$w_{nr} \cong w_{nr}^{(0,interface)} F_{SRH}(z_i),$$

where $z_i$ is the location of the interface, and $w_{nr}^{(0,interface)}$ is the interface characteristic scale constant. Since both bulk and interface rates depend on the factor $F_{SRH}(z)$, which depends on the overlap of the electron and hole densities, one expects the SRH recombination rates to also be suppressed by the charge separation during the shelving phase. The factor $F_{SRH}(z)$, calculated from our wavefunctions, is shown in FIGS. 14 and 15 to be reduced by several orders of magnitude during the shelved configuration. Using these result, we have found that, for the bulk SRH rate, we have nonradiative recombination rate suppression ratios:

$$R_{nr} = \frac{w_{nr}^{shelving}}{w_{nr}^{emission}} = 3.4 \times 10^{-6},$$

and for the interface rate.

$$R_{nr} = \frac{w_{nr}^{shelving}}{w_{nr}^{emission}} \cong 5 \times 10^{-7}.$$

Auger Recombination

For the analysis of the Auger recombination rate, we may write the quantum well electron wavefunction in the form $$\varphi_{vkl}(r, z) = \frac{1}{A} e^{ik \cdot r} \xi_{vl}(z) u_{vk}(r, z)$$

where $u_{vk}(r, z)$ is the lattice-periodic unit-cell part of the Bloch wavefunction with band label v and crystal momentum k, r represents the in-plane spatial coordinates, $\xi_{vl}(z)$ is the quantum well envelope function of subband l, and A is a normalization constant. The Auger recombination rate is proportional to the (absolute) square of the Coulomb scattering matrix element between two electrons, which is given by $$V_{1,2,3,4}^c \cong V_{k_1-k_3}^c F_{1,2,3,4}(|k_1-k_3|) \delta_{k_1-k_3,k_4-k_2} \left\langle u_{v_1 k_1} \middle| u_{v_3 k_3} \right\rangle_{cell} \left\langle u_{v_2 k_2} \middle| u_{v_4 k_4} \right\rangle_{cell}$$

with $$F_{1,2,3,4}(q) = \int dz dz' \xi_{v_1 l_1}^*(z) \xi_{v_2 l_2}^*(z') e^{-q|z-z'|} \xi_{v_3 l_3}(z) \xi_{v_4 l_4}(z')$$

For the Auger process illustrated in FIG. 13, we can take, as an example, $v_1=V1$, $v_2=C2$, $v_3=C1$, $v_4=C1$. This matrix element also depends strongly on the overlap of the electron and hole wavefunctions. For q=0 it contains a factor identical to the overlap matrix element that controls the radiative decay. Hence the Auger process is suppressed by charge separation similarly efficiently as the optical transition process during the shelving phase.

Carrier Capture

Figure 16A:
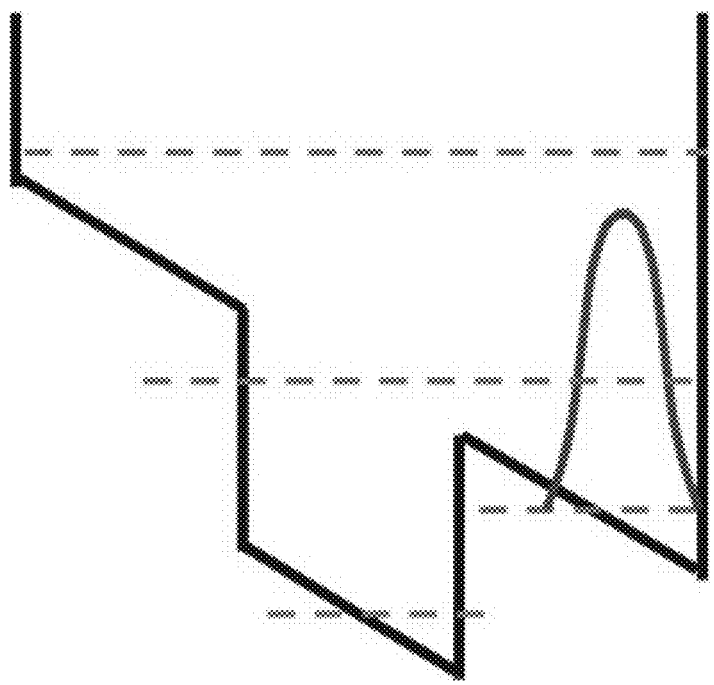
FIG. 16A shows a schematic of an electron wavefunction during shelving.
Figure 16B:
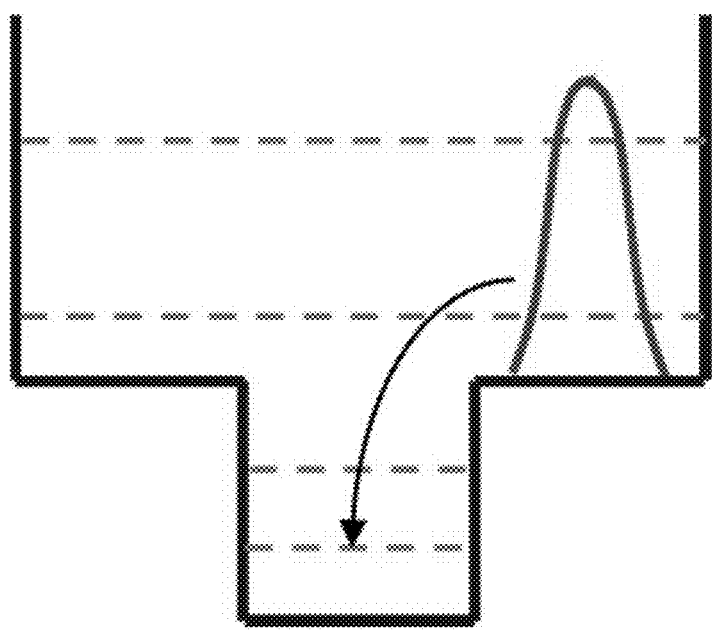
FIG. 16B shows a schematic of the electron capture after switching.

The L-switching processes involves complex dynamics of the charge distribution and, during the E-field switch-off process, local charge recombination of the initially spatially separated charges. The charge recombination is accompanied by a carrier capture into the well (FIGS. 16A and 16B). The time scale of this capture process depends on various variables, including the system's temperature, excitation density, and the details of the band profile. The time scale is expected to be in the picosecond regime. FIG. 16A shows a schematic of an electron wavefunction during shelving and FIG. 16B shows a schematic of the electron capture after switching. Therein, the shelving phase of FIG. 16A may serve as an approximate initial condition for scattering and capture in the unbiased structure of FIG. 16B.

Leakage Due to Tunneling

Figure 17B:
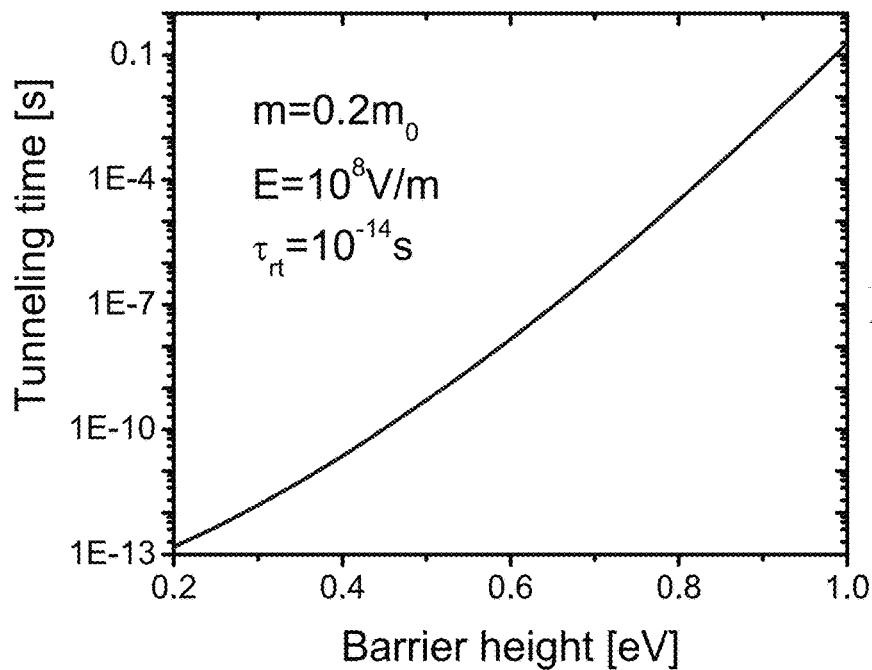
FIG. 17B shows estimated calculations of tunneling time in such an exemplary structure.

Another important aspect of the structure design is the importance of the large confinement barriers provided by the cladding material. The cladding barrier, $\Delta_{cladding}$, may be chosen high enough (for both electrons and holes) such that carrier leakage due to tunneling (FIGS. 17A and 17B) will not degrade the device performance. FIG. 17A shows a band diagram schematic of carrier leakage due to tunneling in an exemplary structure. FIG. 17B shows estimated calculations of tunneling time in such an exemplary structure.

Initial simplified estimates for the tunneling time based on a kinetic model involving a round-trip time and a transmission coefficient T yield the following expression for the tunneling time (subscript tn) $\tau_{tn} \cong \tau_{rt}/T$, where $\tau_{rt}$ is the round-trip time in the well (here barrier/well/barrier) section, and $$T \cong \exp\left(-(4l/3\hbar)\sqrt{m_e \Delta_{cladding}}\right),$$

and with l being the effective tunneling distance. Preliminary estimates shown in FIG. 17B show that the design shown in FIGS. 4 and 5 will not suffer from leakage problems. However, the design in FIGS. 4 and 5 assumes an AlN or sapphire cladding, and a sapphire cladding would provide a particularly large confinement potential, but may lead to lower crystal quality of the III-nitride segments than an AlN cladding.

For a pump duration of 1 microsecond, a barrier of approximately 0.7 eV is needed. The design shown in FIGS. 4 and 5 substantially surpasses this requirement for both electrons and holes and can therefore be expected to perform without leakage problems. For smaller cladding barriers, provided for example by AlN cladding, a more realistic theory for the tunneling is needed in order to obtain precise predictions of the tunneling process and to prevent leakage problems during the pumping/shelving phase of the L-switching process.

A rate-equation model may be used to simulate the operation of an L-switched laser. The following describes the predicted performance of an L-switched laser composed of the pumped light emitting unit described in the previous section placed inside a resonance cavity. The model is described in detail below.

This model is an adaptation of an established model, used for lasers with bulk semiconductor emitters, to the two-dimensional, quantum well setting. The model equations govern the evolution of the (planar) densities of pumped electrons, $N_e$, and holes, $N_h$, which are assumed to be equal ($N_e = N_h \equiv N$), the electron density in the active spectral range (e.g., lasing window), $n_e$, (see FIG. 18) the hole density in the lasing window, $n_h$, and the (planar) cavity photon density, S.

Figure 18:
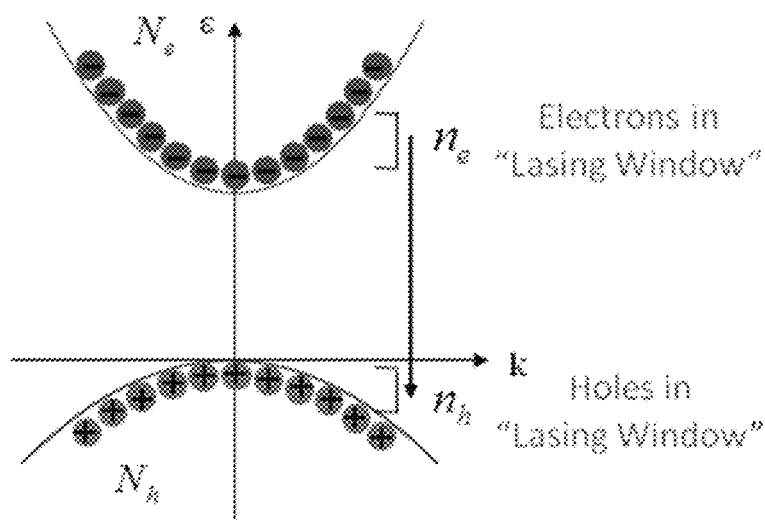
FIG. 18 shows an exemplary embodiment of band diagram showing carrier energies as functions of momentum in the plane of the quantum well.

FIG. 18 shows an exemplary embodiment of band diagram showing carrier energies as functions of momentum in the plane of the quantum well. Momentum conservation restricts optical transitions to between states with almost equal momenta. The spectral ranges in the two bands in resonance with the laser constitute a "lasing window."

We show here the results of a simulation of the L-switch operation in the quantum well laser. For the lasing mode, we chose the wavelength $\lambda = 532$ nm and the linewidth $\delta\lambda = 6$ nm. The other parameter values are set as follows: $m_e = 0.22\, m_0$, $m_h = 0.40\, m_0$, where $m_0$ is the free electron mass, $\tau_s = 1.0 \times 10^{-10}$ s, $\tau_{1e} = \tau_{1h} = 1.0 \times 10^{-12}$ s, $\tau_p = 8.3 \times 10^{-10}$ s, $\langle r \rangle^2 = (5 \times 10^{-10}\text{ m})^2$, $|\Phi(z_{QW})|^2 = 10^7$ m$^{-1}$, $\alpha_f = 0$, $\beta = 0.01$, $\beta'_2 = 0$, $\Gamma = 1$, $\varepsilon_{cav} = 6.25$, T=298 K, $\alpha_{cav} = 0$. The non-radiative lifetime $\tau_s$ and the optical transition dipole squared $\langle r \rangle^2$, to which all the emission rates are proportional, are set to their 'normal' values, i.e. the values under the flat-band condition in the emission phase (FIG. 11), where the electron and hole wavefunctions overlap maximally. During the shelving phase in the simulation, to account for the effect of wavefunction (charge) separation, $\tau_s$ is lengthened by a factor of $1/f_s = 10^6$ while $\langle r \rangle^2$ is reduced by a factor of $f_r = 10^{-10}$:

$$\langle r \rangle^2(t) = [1-s(t)]\langle r \rangle^2 + s(t) f_r \langle r \rangle^2$$

$$\tau_s(t) = [1-s(t)]\tau_s + s(t) f_s \tau_s$$

with the smooth switching function $$s(t) = \frac{1}{e^{(t-t_{dump})/t_s} + 1}$$

Figure 19:
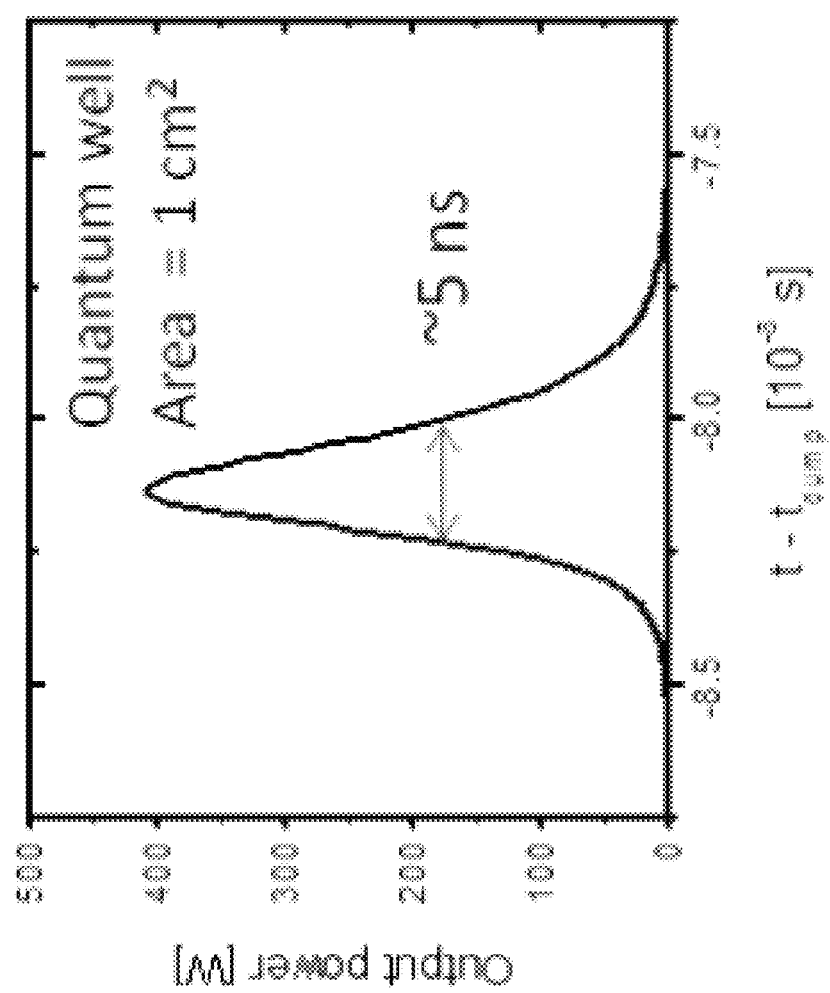
FIG. 19 shows output power of a light pulse from an exemplary L-switched laser.
Figure 20A:
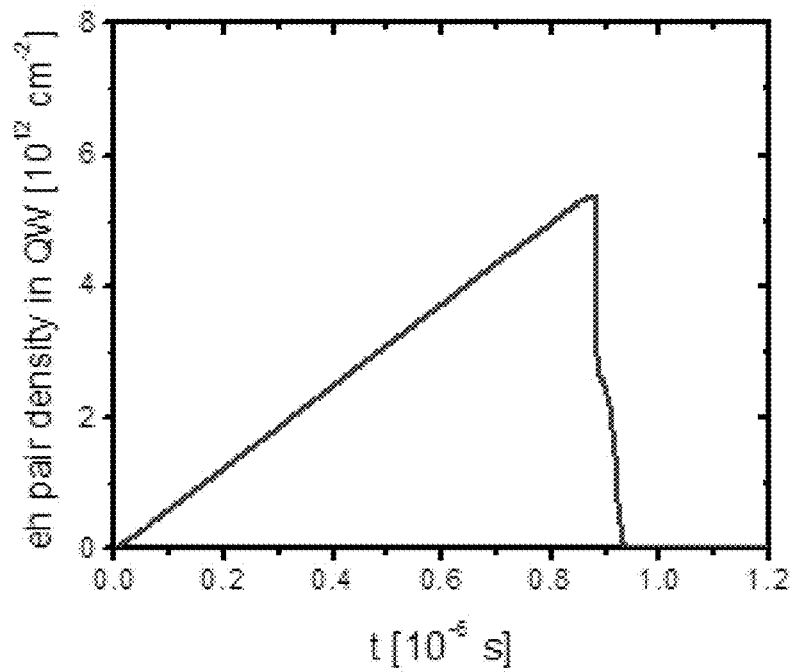
FIG. 20A shows shelved electron/hole pair density as a function of time.
Figure 20B:
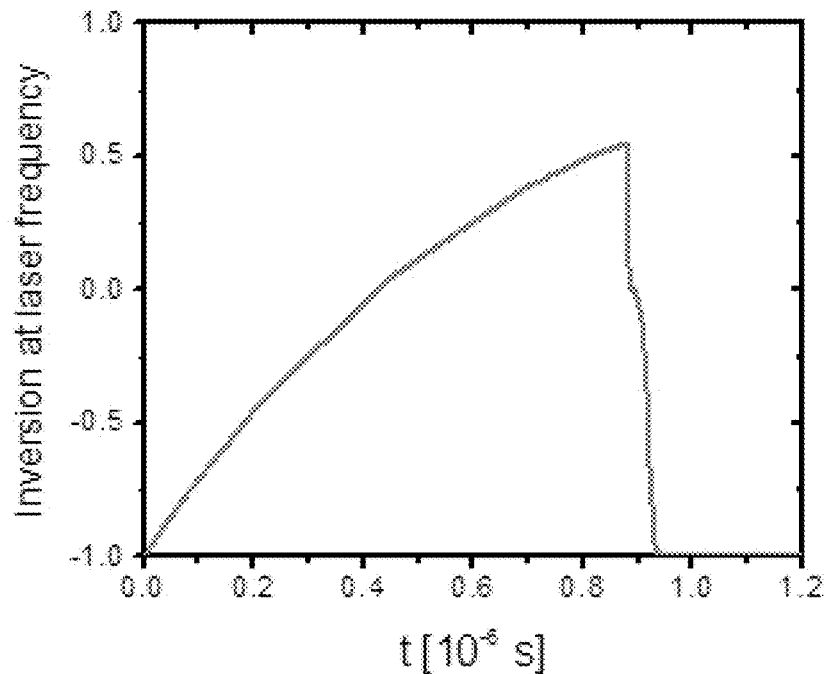
FIG. 20B shows population inversion at the laser frequency as a function of time.

For each laser pulse, the length of the shelving phase is set at $10^{-6}$ s, during which the pump current is kept on. At the end of this period, $t_{dump}$, the parameters $\tau_s$ and $\langle r \rangle^2$ are smoothly changed to their emission phase values of a switching duration of $t_s = 10^{-8}$ s. The calculated results for the various densities for a pump current density of $10^4$ A/m$^2$ and a quantum well area of 1 cm$^2$ are shown in FIGS. 19, 20A and 20B. FIG. 19 shows output power of a light pulse from an exemplary L-switched laser as described. The total energy density in the pulse is approximately 0.01 J/m$^2$. FIG. 20A shows shelved electron-hole density, N, as a function of time. FIG. 20B shows population inversion, $1-f_e-f_h$, where $f_e$ and $f_h$ are the averaged electron and hole occupation probability, respectively, in the lasing window.

It can be seen in FIG. 20A that up to $6 \times 10^{12}$ electron-hole pairs per cm$^2$ are stored and in FIG. 19 that the energy is released as a 5-ns laser pulse with an energy density of 0.01 J/m$^2$. If we assume the electron-hole pairs are injected at the lasing frequency, the internal efficiency of this simulation run is given by:

$$\text{Internal efficiency} = \frac{\text{Output energy/pulse}}{\text{Injected energy/pulse}} = 0.44.$$

A more detailed discussion of efficiencies appears in the next subsection.

Figure 21A:
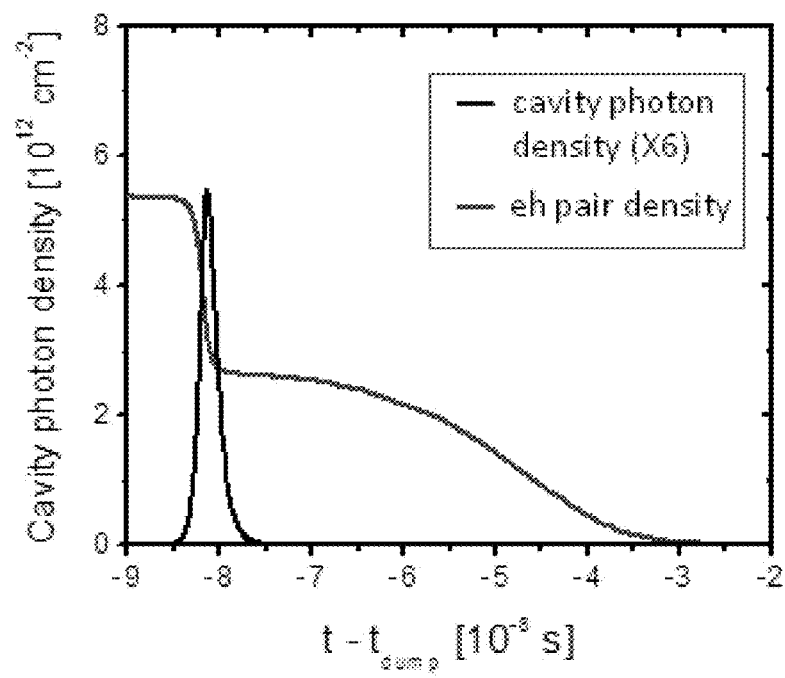
FIG. 21A shows additional detail of cavity photon density and electron/hole pair density around the switching time.
Figure 21B:
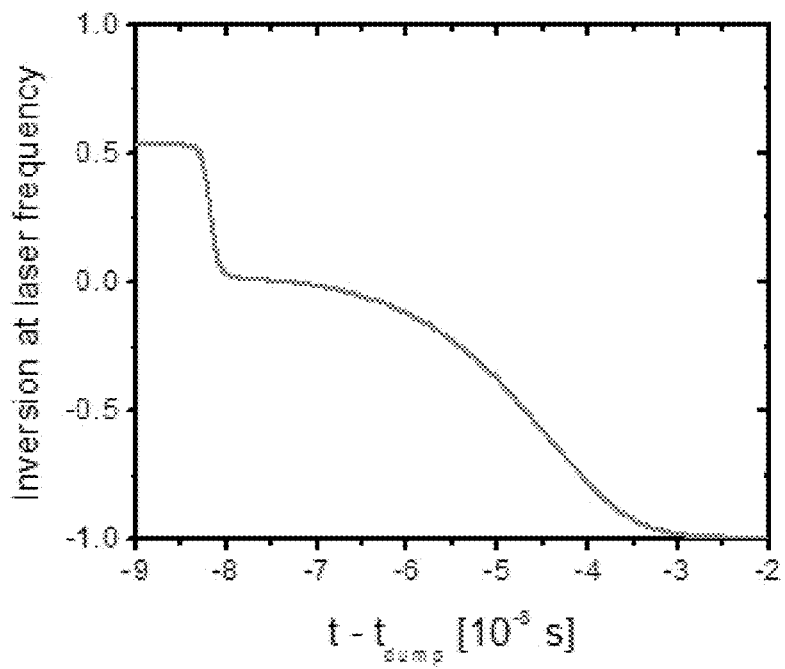
FIG. 21B shows additional detail of population inversion at the laser frequency around the switching time.

FIGS. 21A and 21B show additional detail of cavity photon density and electron/hole pair density and population inversion at the laser frequency around the switching time. The results are plotted in more details over a 100-ns interval around the switching time $t_{dump}$. It can be seen that lasing stops when the shelved electron-hole density drops to a threshold level where the corresponding inversion in the lasing window is near zero. The pulse duration is determined by the model parameters given above that govern the stimulated emission process, as well as the switching function s(t). The pulse duration of about 5 ns shown in FIGS. 19, 20A and 20B, where a switch duration $t_s$ of 10 ns has been used, does not represent the theoretical minimum for achievable pulse durations.

We define the internal efficiency of our model L-switched quantum well laser by $$\eta_q = \frac{P_{ph}}{I_{abs} t_{dump}},$$

where $$P_{ph} = \frac{1}{\tau_p} \int dt\, S(t)$$

is the number of photons per unit area in the output laser pulse, and $I_{abs}$ is the pump current absorbed by the quantum well/electronic charge/unit area.

For the sake of analysis, it is useful to write this efficiency as a product of two component efficiencies: $\eta_q = \eta_{pump} \eta_{output}$.

The pump efficiency is defined as $$\eta_{pump} = \frac{N_{max}}{I_{abs} t_{dump}},$$

where $N_{max}$ is the maximum shelved electron-hole density immediately before the switching, and the output efficiency is defined as $$\eta_{output} = \frac{P_{ph}}{N_{max}}.$$

The output efficiency measures how much of the stored energy in the quantum well during the shelving phase is converted into output laser energy. We recall that (FIG. 21) lasing stops when N drops to a level, which we now denote by $N_{th}$, when the inversion in the lasing window is near zero. Therefore, the maximum energy density that can be extracted, even when all dissipation losses can be neglected, is $N_{max}-N_{th}$, which gives an upper bound to the output efficiency:

$$\eta_{output} \le \frac{N_{max} - N_{th}}{N_{max}}.$$

Figure 22:
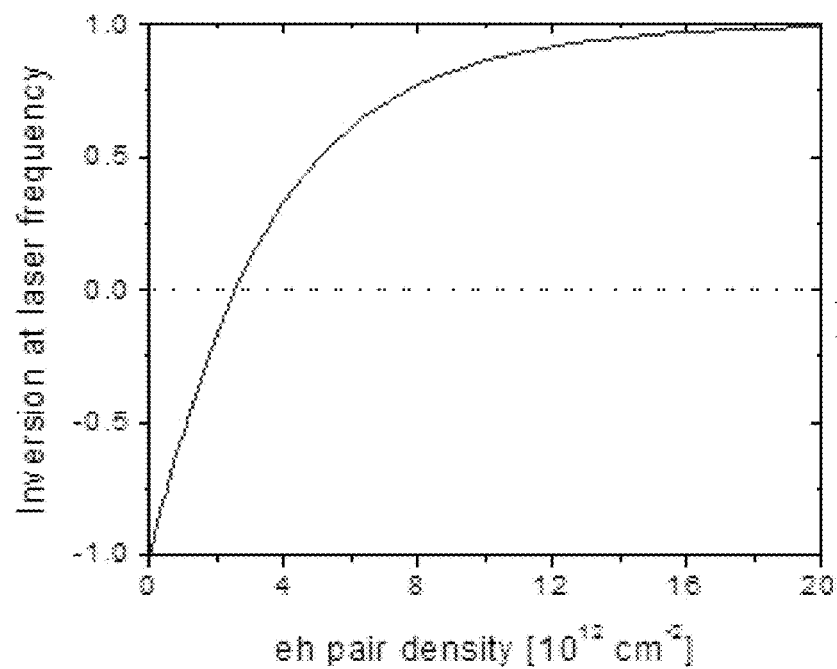
FIG. 22 shows a graph of exemplary population inversion at the laser frequency versus the shelved electron/hole pair density.

We plot the inversion at the lasing frequency against the shelved carrier density for the parameter values chosen in the simulation in FIG. 22, where we can read out a value for the threshold level $N_{th} \approx 2.6 \times 10^{12}$ cm$^{-2}$, which, with $N_{max} \approx 6 \times 10^{12}$ cm$^{-2}$, gives $\eta_{output} \le 0.56$. FIG. 22 shows a graph of exemplary population inversion at the laser frequency versus the shelved electron/hole pair density.

Figure 23:
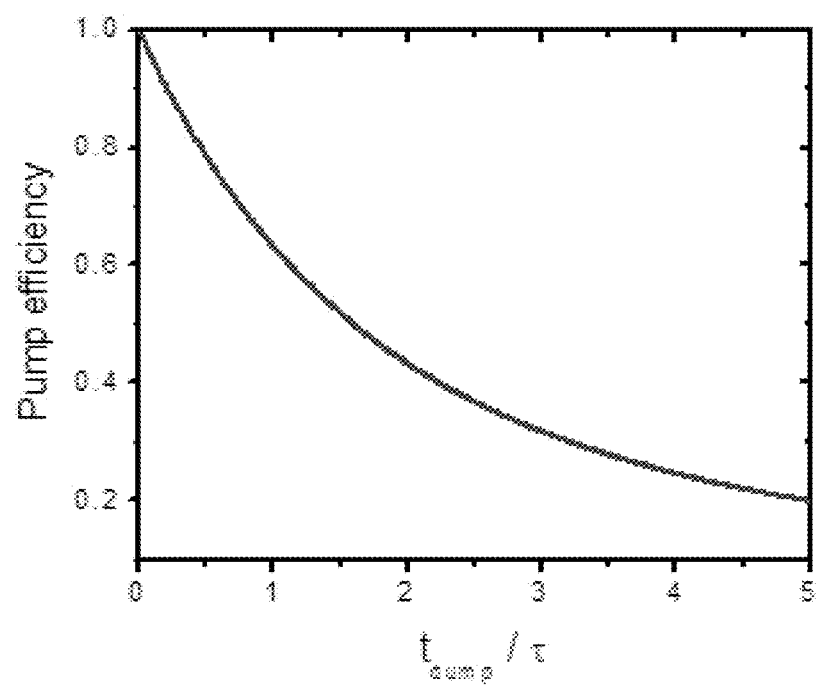
FIG. 23 shows a graph of pumping efficiency versus switching time.

FIG. 23 shows a graph of the dependence of the pump efficiency on the switching time $t_{dump}$. Therein, $\tau$ is the decay time of the shelved carrier density.

For the pump efficiency, a simple analytic estimate can be obtained as follows. We approximate the equation for the electron-hole density during the shelving phase as $$\frac{dN}{dt} \approx I_{abs} - \frac{N}{\tau},$$

where $\tau$ is the decay time for N. This gives $N(t) = \tau I_{abs} (1 - e^{-t/\tau})$. Since $N_{max} = N(t_{dump})$, an estimate of the pump efficiency can be obtained:

$$\eta_{pump} = \frac{N_{max}}{t_{dump} I_{abs}} \approx \frac{\tau}{t_{dump}} (1 - e^{-t_{dump}/\tau}).$$

This estimated value for this efficiency is plotted in FIG. 23. We note that this efficiency is independent of $I_{abs}$ and $N_{max}$.

Combining the bounds on $\eta_{pump}$ and $\eta_{output}$, we obtain an estimated bound on the internal efficiency $$\eta_q = \eta_{pump} \eta_{output} \approx \left(\frac{N_{max} - N_{th}}{N_{max}}\right) \frac{\tau}{t_{dump}} (1 - e^{-t_{dump}/\tau}) =$$

$$0.56 \times \frac{\tau}{t_{dump}} (1 - e^{-t_{dump}/\tau})$$

It can be seen from FIG. 23 that the $\eta_{pump}$ is higher for smaller $t_{dump}$. Since the desirable level of $N_{max}$ is set by other considerations, e.g. $\eta_{output}$ and the electric field generated by the separated charges, one can adjust the absorbed input current to reduce $t_{dump}$ while keeping $N_{max}$ at a favored level.

Figure 24A:
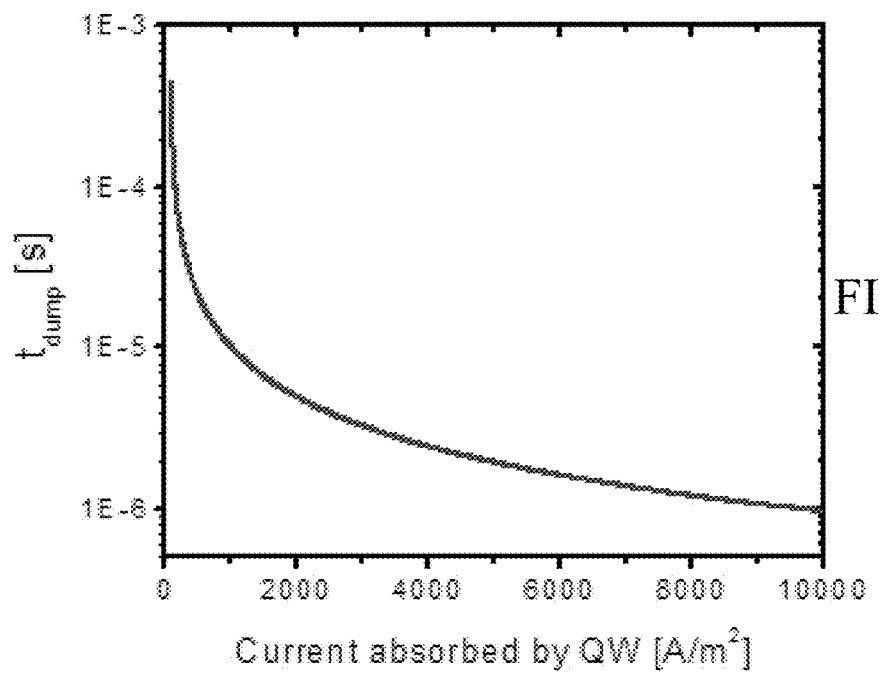
FIG. 24A shows a graph of switching time versus absorbed current density.
Figure 24B:
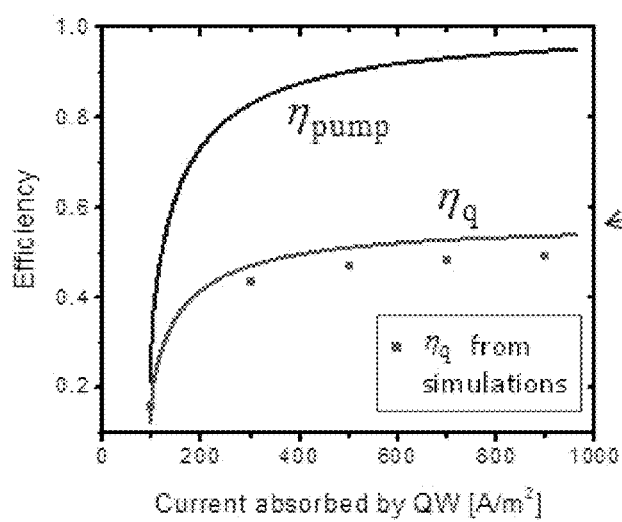
FIG. 24B shows analytic estimates of efficiencies for the noted efficiencies for an L-switched emission versus absorbed current density (solid lines), as compared with simulation results (squares).

FIG. 24A shows a graph of switching time versus absorbed current density whereas FIG. 24B shows analytic estimates of efficiencies for the noted efficiencies for an L-switched emission versus absorbed current density (solid lines), as compared with simulation results (squares).

In FIG. 24A, we show this dependence of $t_{dump}$ on $I_{abs}$ for a desired target density of $N_{max} = 6 \times 10^{12}$ cm$^{-2}$ and $\tau = 10^{-4}$ s that follows from $$N(t_{dump}) = N_{max} = \tau I_{abs} (1 - e^{-t_{dump}/\tau}).$$

FIG. 24B shows, for the same level of $N_{max}$, the internal efficiency as estimated by the above equation. It agrees very well with the computed value from the results of our simulations.

We conclude with a comparison of the predicted performance characteristics of our simulated L-switched laser with exemplary target specifications. The target delivered power is taken to be 50 W at 400 pulses/s, or an energy of 125 mJ/pulse. With $N_{max} = 6 \times 10^{12}$ cm$^{-2}$ and $\eta_{output} = 0.56$, the maximum energy per pulse from our laser is 13 mJ/m$^2$.

Power Scaling

We present three scaling mechanisms that may be used to increase the overall output power: multiple wells per emitter, multiple emitters per laser cavity, and incoherent beam combining of multiple cavities.

Figure 25A:
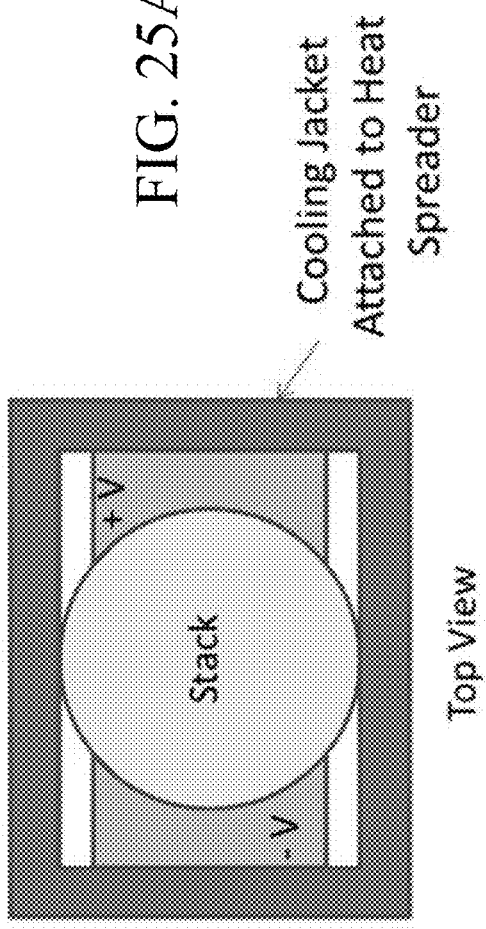
FIG. 25A shows an exemplary embodiment of a multiple layer emitting device with interdigitized electrodes from a top view.
Figure 25B:
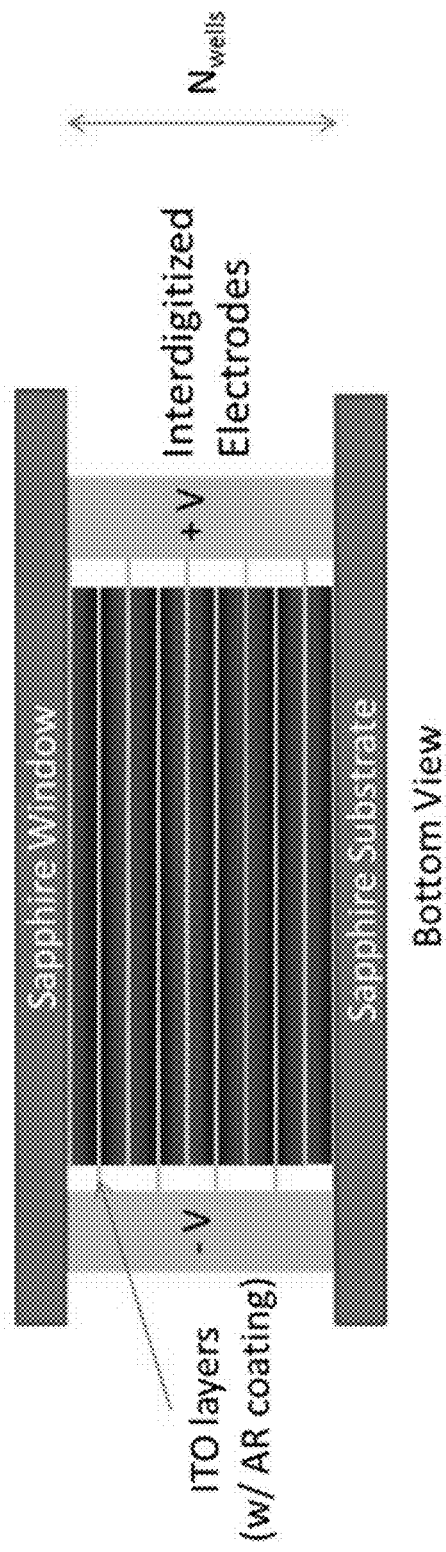
FIG. 25B shows an exemplary embodiment of a multiple layer emitting device with interdigitized electrodes from a side view.

FIGS. 25A and 25B show top and side views of a concept for single emitting element composed for multiple layers of switched quantum wells. In this arrangement, interdigitized conductive layers will be used to maintain separation between alternating voltage polarities and avoid electrical breakdown. The electrodes consist of thin films of Indium Tin Oxide (ITO), or other transparent conductive materials, between each layer and the polarities of the p-n junctions are alternating between electrodes. The component may be cooled through thermally conductive windows (e.g. Sapphire or SiC) on both sides of the element.

An estimate on the thickness of each layer is 5 µm or more, and one may project that 200 layers of switched quantum layers may be constructed within a 1 mm thick integrated component. This thickness is sufficient to limit the risk of electrical breakdown between layers along the sides of the device. Though one side of the device could include a grown distributed Bragg reflector, as typically used in VECSELs, transparent top and bottom windows may allow for more compact arrangements of multiple devices in a single laser cavity.

However, placement of the device with respect to the standing modes of the cavity may become more of a challenge in that case. To assure reasonable overlap between quantum wells and antinodes, a diversity of quantum well spacings may be included within the design. Alternatively or additionally, the laser may be configured in a ring-cavity.

One may also use multiple emitting elements within a single cavity as shown in FIGS. 26A and 26B. In this diagram, the cavity traverses 9 separate gain elements. These may be grown on a single substrate. Provided that these components can be made to support high transmission surfaces, a relatively compact serpentine cavity may be made using turn mirrors, as depicted in the side view. A slightly less compact version of the concept could be used if the bottom surfaces of the gain elements are constructed with DBR reflectors.

Using a concave-convex mirror arrangement results in modest variation in beam size within the cavity and enables high overlap efficiency with the individual gain elements. In the top view, the positive and negative electrodes are shown that engage the interdigitized conductive layers within each gain region. Since fast triggering times will be needed, the capacitance between the positive and negative polarity electrodes should be minimized. One way to do this is to limit the ITO conduct layers to the regions where gain will be created and mask the ITO layers so that conduction is not allowed between emitters.

Beam Combining with Arrays and Tiers

Figures 27A, 27B:
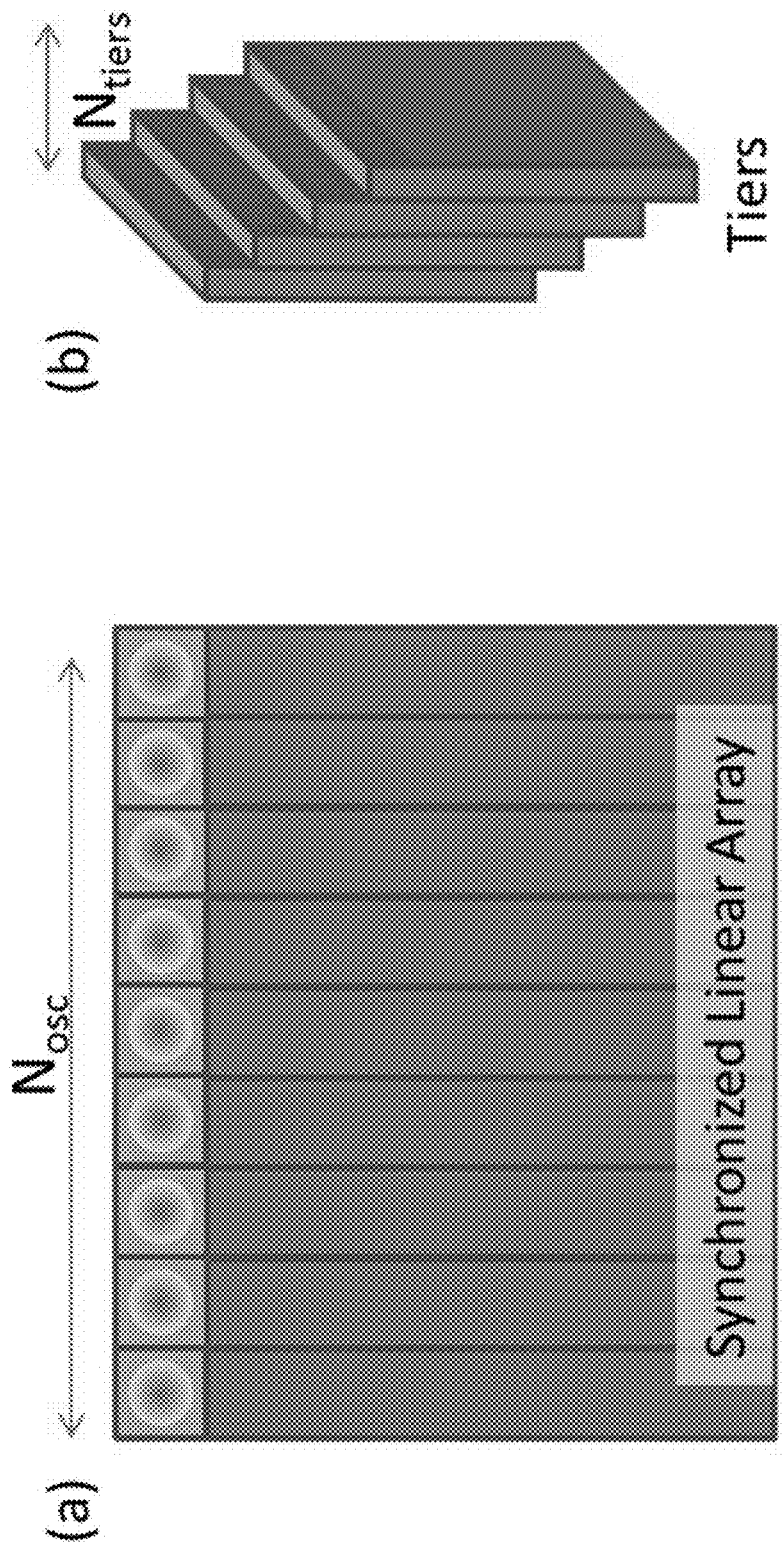
FIG. 27A shows an exemplary embodiment of a structure with multiple gain elements within a single integrated layer as a synchronized linear array.
FIG. 27B shows an exemplary embodiment of a structure with multiple gain elements arranged as displaced tiers.

Multiple L-switched cavities may be arranged in arrays and synchronously triggered. FIG. 27A illustrates an array of cavities that may be integrated within a single integrated layer as a synchronized linear array.

The concept here is that multiple iterations of the architecture shown in FIGS. 26A and 26B may be assembled as a single integrated component. In this arrangement, the electrodes for each successive cavity may be reversed in polarity so that the electrodes between each cavity may be shared if necessary. For applications where illumination at range is required, it will be important to design and calibrate the output lens alignment so to minimize or control the divergence in beam directions. However, for many applications, where a large aperture is not required, incoherent beam combining from multiple elements may be adequate.

Given the architecture shown in FIG. 26A for each cavity, a tightly packed array of emission beam lines can be achieved by stacking the linear arrays in displaced tiers as shown in FIG. 27B.

This arrangement results in a compact $N_{layer} \times N_{tier}$ array of aligned and synchronized pulsed laser that is suitable for line illumination in applications that do not have stressing divergence requirements. It is also worth noting that such a laser array may be used as a pump source for pulsed solid-state gain materials having short upper state lifetimes and requiring short pump pulse durations.

One possible embodiment of the invention includes the following specifications for a 3 mm radius beam waist within a cavity and proving a total quantum well area $A_{QW} = 2.83 \times 10^{-5}$ m$^2$:
 Use $N_{wells} = 200$ Quantum Wells per Stack
 Use $N_{stacks} = 24$ Stacks per Oscillator
 Use $N_{Osc} = 15$ Oscillators per Tier
 Use $N_{Tiers} = 5$ Tiers in an Array This embodiment uses quantum well stacks, oscillators, and tiers fabricated in a tightly integrated and reproducible manner. If we assume that each of stacked quantum well devices requires 1.0 cm$^3$ (including surrounding roof mirrors and packaging space), the overall optical system might end up being about 10"×6"×2".

Additional Considerations

Though most of the above description has been tied to applications for high peak power green laser emission with an InGaN material system, this invention includes the described processes and methods applied to other material systems and architectures. Materials may be based on organic semiconductors or inorganic semiconductors. Gain elements may include one or more quantum confined volumes in physical contact with barrier materials such that an external electric field moves electrons or holes substantially into the barrier materials to reduce the probability of recombination. A cladding material may be used between the barrier material and electrode surfaces. The cladding materials may be arranged to form a p-n junction to enable current injection into the barrier or quantum well region, or to provide electric field control for switching the recombination lifetime within one or more quantum wells. The quantum confined volumes may be shaped for quantum confinement in one, two, or three dimensions (quantum wells, wires, or dots).

Figure 28:
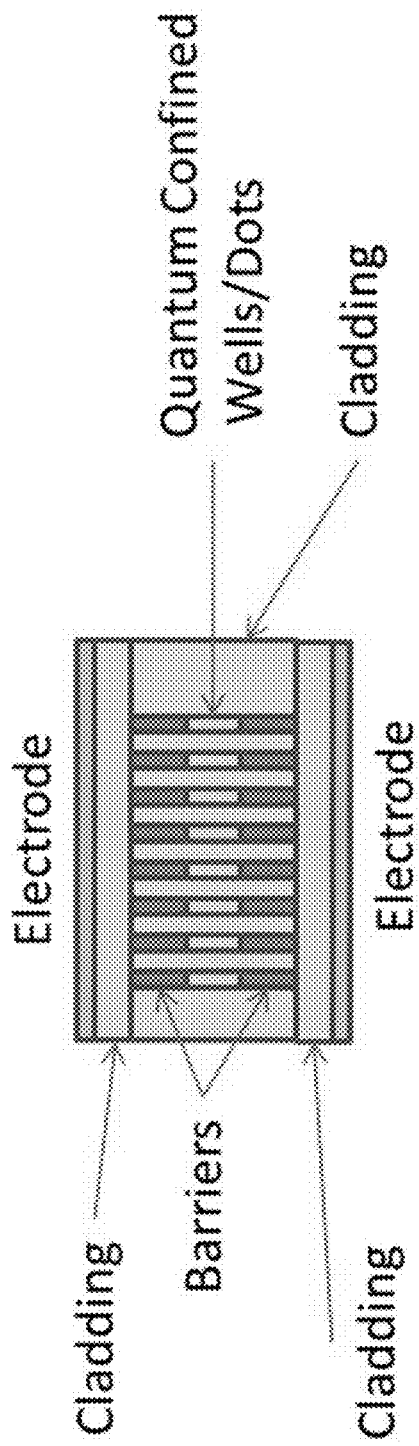
FIG. 28 shows an exemplary structure for zero-dimensional and one-dimensional quantum confined volumes.
Figure 29:
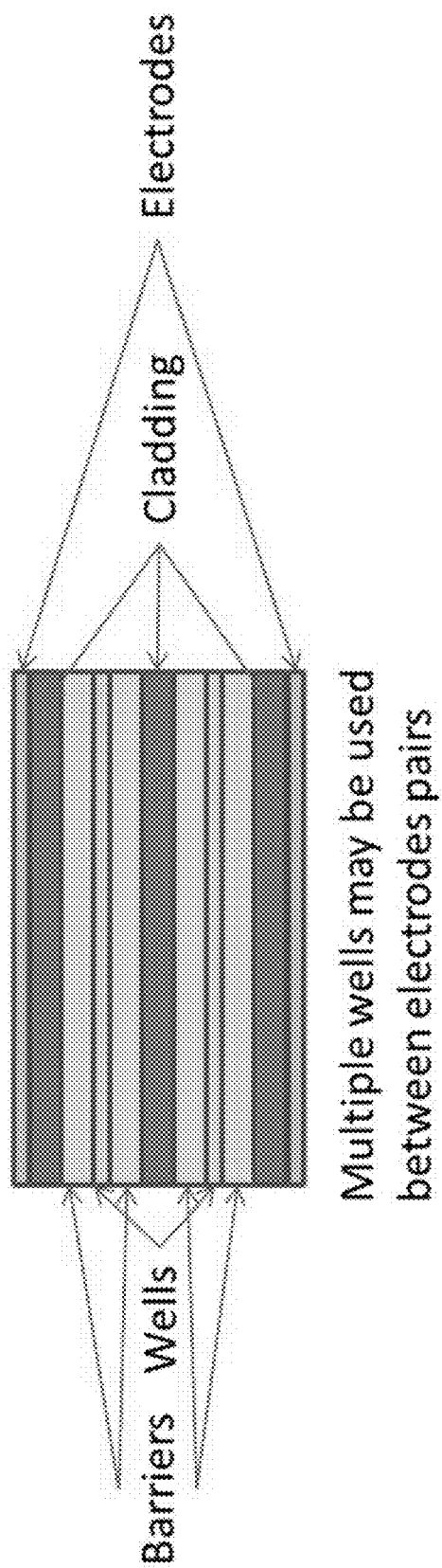
FIG. 29 shows an exemplary gain stack with multiple quantum wells per electrode pair.

There are many different configurations of the described embodiment, here laid out in specificity. FIG. 28 shows an exemplary structure for zero-dimensional and one-dimensional quantum confined volumes. One or more quantum wells may be inserted between opposite polarity electrodes. Multiple alternating-polarity electrodes may be used to integrate multiple emission regions within a single integrated gain element. FIG. 29 shows an exemplary gain stack with multiple quantum wells per electrode pair.

Figure 30:
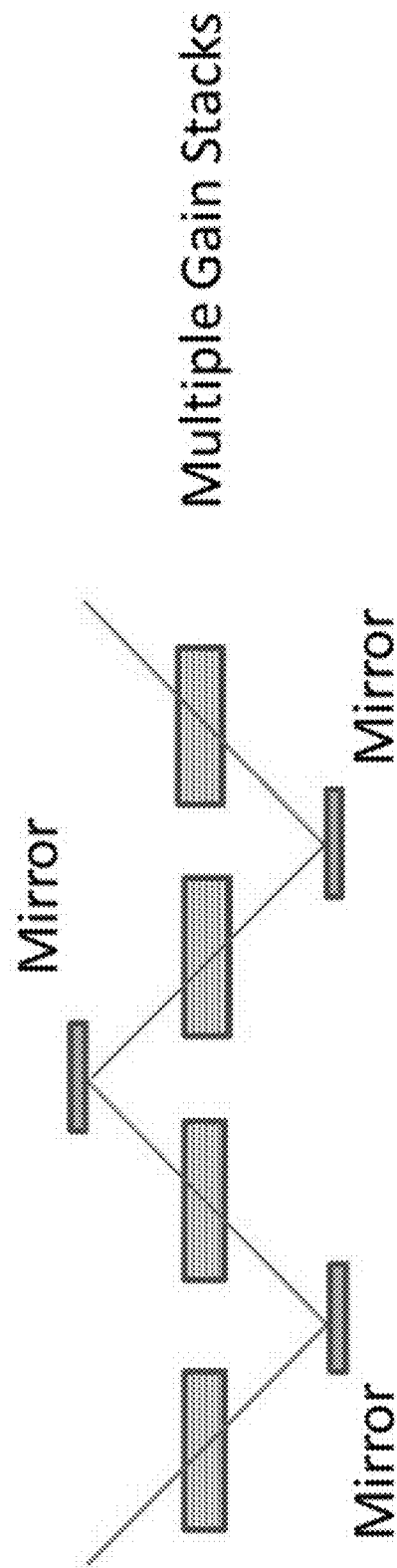
FIG. 30 shows an exemplary configuration for using multiple transmissive gain stacks in succession.
Figure 31:
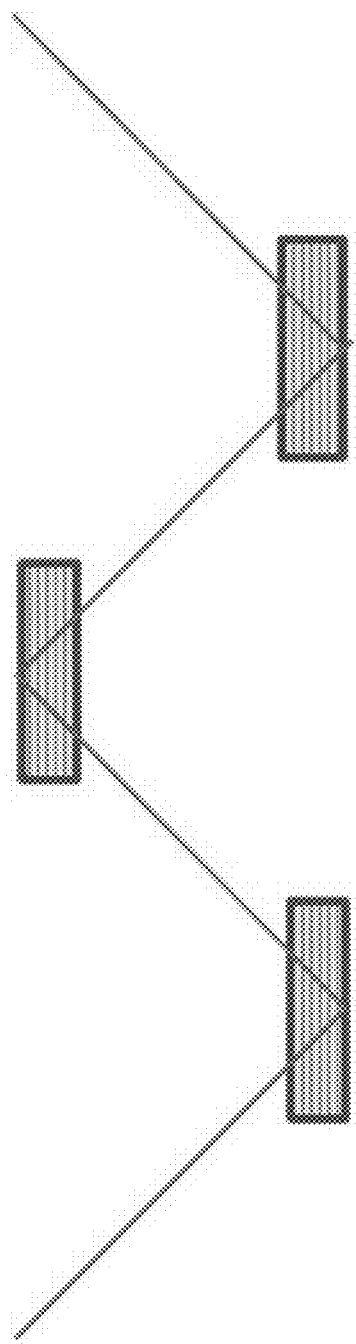
FIG. 31 shows an exemplary configuration for using multiple reflective gain stacks in succession.

The gain elements may be transparent or include one or two integrated reflective surfaces. FIG. 30 shows an exemplary configuration for using multiple transmissive gain stacks in succession. FIG. 31 shows an exemplary configuration for using multiple reflective gain stacks in succession.

The described gain elements may be optically or electrically pumped. For optical pumping, the optical pump source may be external to the device or may be included as one or more integrated diode optical sources.

Figure 32:
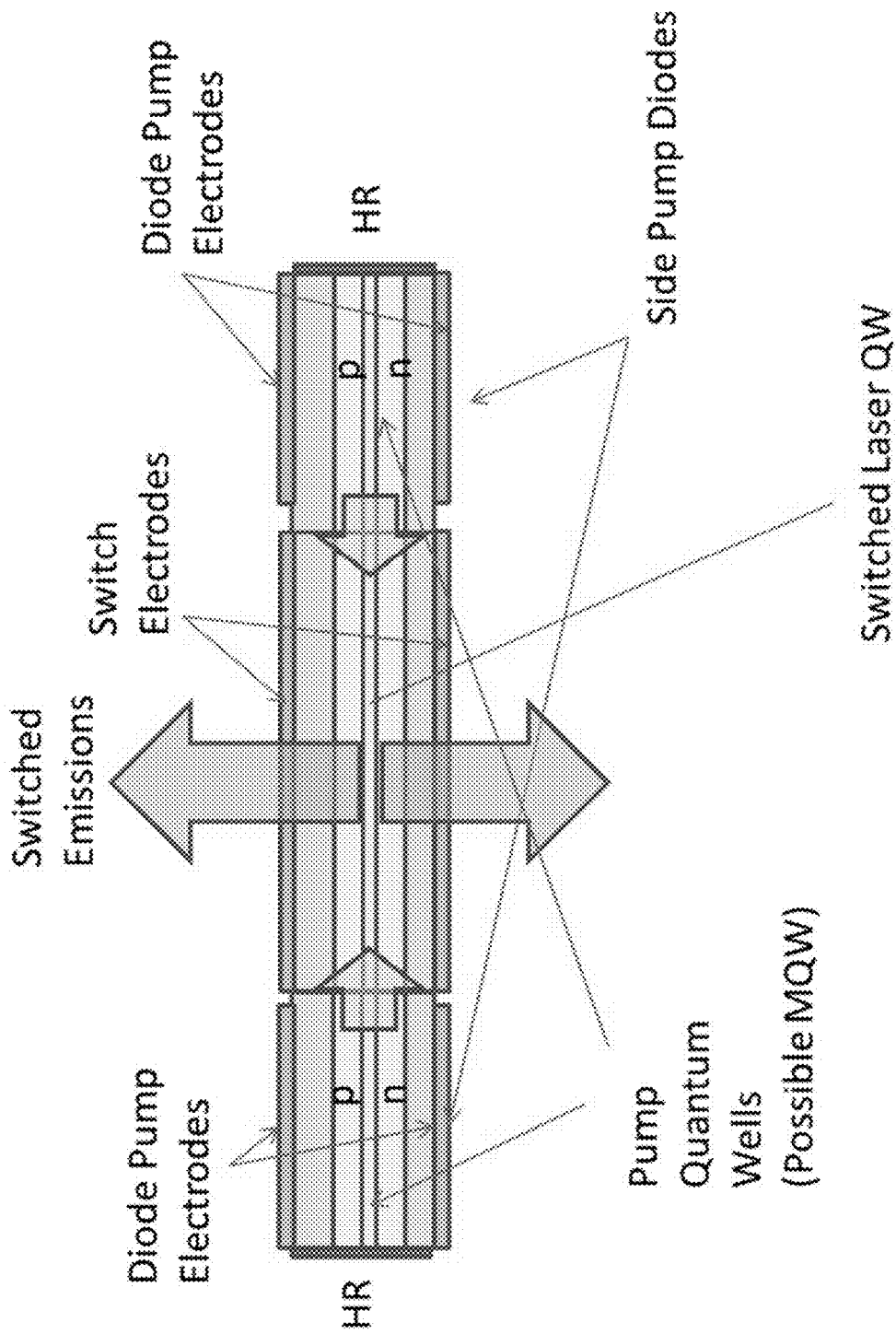
FIG. 32 shows an exemplary configuration for using side-pumping diodes with an integrated switched gain element.

FIG. 32 shows an exemplary configuration for using side-pumping diodes with an integrated switched gain element. In FIG. 32, the HR surfaces are highly reflective surfaces for the pump diodes which are directed through output coupler interfaces (not shown) towards the quantum well structures within the switched laser region of the device.

Figure 33:
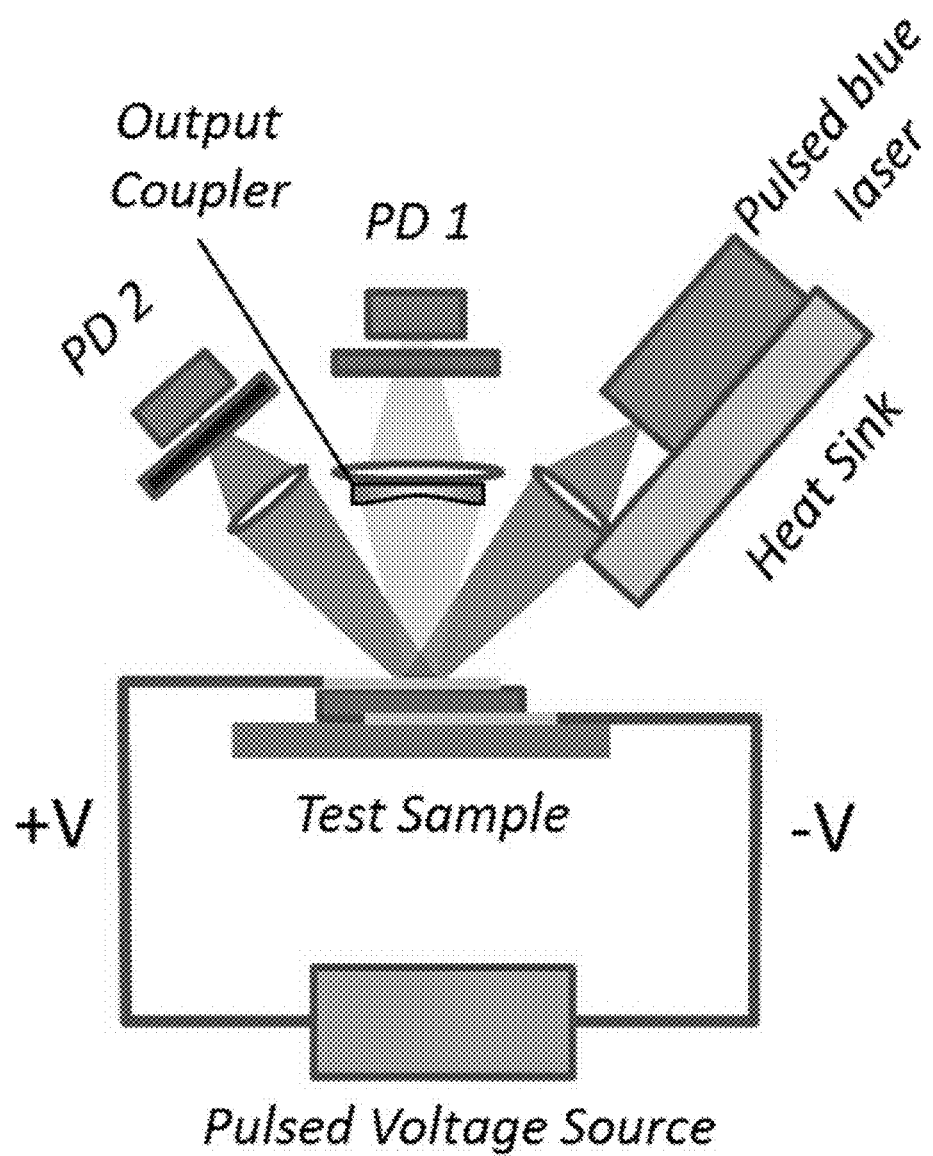
FIG. 33 shows an exemplary configuration for using external optical pumping with a gain element.

FIG. 33 shows an exemplary configuration for using external optical pumping with a gain element. One or more of the described gain elements may be inserted within an optical cavity. A spectral filter within the cavity may additional inhibit stimulated emission at the stark-shifted emission wavelength(s) of the gain elements during the pumping stage.

A Laser Model of Quantum Well Lasers

A semiconductor quantum well laser model has been developed to begin exploring electrical modification of lifetimes through electrostatic charge separation in laser systems. This model is adapted from theory presented in open literature. The model is briefly discussed in this section without detailed derivations. We have implemented the model in a Matlab code, initially with some of the parameters turned off (two-photon absorption and free carrier absorption). The confinement factor is currently set to unity for consistency with a VECSEL type architecture.

This model tracks the dynamics of a 2-D carrier density (N). The total electron and hole carrier densities are equal to preserve charge neutrality. However, the portion of the electron and hole distributions that provide energy transitions within the laser cavity mode linewidth are segregated as active carrier conduction and valence band densities, $n_e$ and $n_h$. A cavity photon density, S, is also included within the set of rate equations.

The model currently includes the following input parameters:

I = injection current (Amps)
A = QW Area (m$^2$)
$\Gamma$ = confinement factor (unitless)
$m_e$ = electron effective mass (kg)
$m_h$ = hole effective mass (kg)
$\omega_0$ = optical frequency of laser (Hz)
$\delta\omega$ = laser line width (Hz)
T = Temperature (K)
$\alpha_f$ = free carrier absorption (m$^2$/s)
$\beta$ = proportion of emissions in lasing mode
$\Gamma_2$ = Two photon absorption parameter
$\beta_2'$ = two photon absorption coefficient
$\tau_s$ = non-radiative decay time (s)
$\tau_{1h}$ = local k-distribution relaxation time for holes (s)
$\tau_{1e}$ = local k-distribution relaxation time for electrons (s)
$E_g$ = Semiconductor Bandgap (J)
$\Phi(z_{QW})$ = photon mode wavefunction at QW (m$^{-1/2}$)
$1/\tau_p$ = radiative loss (1/s)
$\alpha_{cav}$ = other cavity losses (1/s)
$\epsilon_{cav}$ = Dielectric constant of cavity material (unitless)

Additionally, the dipole integral $\langle r \rangle$ is pre-calculated from the quantum well wavefunctions. For simulations where electrons and holes are electrostatically separated prior to optical switching, this parameter is provided as a function of a dynamic externally applied electric field.

The rate equations that are solved are listed below, and some descriptions of the most significant parameters will follow:

$$\dot{N} = \frac{I}{eA} - \frac{N}{\tau_s} - a(n_e + n_h - N_0)S - \alpha_f NS - BN^2 + \frac{\Gamma_2}{\Gamma}\beta_2' S^2 \quad \text{Carrier Density}$$

$$\dot{S} = \left[\Gamma a(n_e + n_h - N_0) - \alpha_f N - \frac{1}{\tau_p} - \alpha_{cav}\right]S + \beta B' n_e n_h - \beta_2' S^2 \quad \text{Photon Density}$$

$$\dot{n}_e = -\frac{(n_e - \overline{n_e})}{\tau_{1e}} - a(n_e + n_h - N_0)S - \alpha_f S n_e - B' n_e n_h \quad \text{Active Electron Density}$$

$$\dot{n}_h = -\frac{(n_h - \overline{n_h})}{\tau_{1h}} - a(n_h + n_e - N_0)S - \alpha_f S n_h - B' n_e n_h \quad \text{Active Hole Density}$$

Several intermediate parameters are calculated from the input parameters:

The thermal parameter $$\beta_B = \frac{1}{k_B T}$$

is convenient in the carrier distribution calculations

The exciton reduced mass:

$$m_\gamma = \left(\frac{1}{m_e} + \frac{1}{m_h}\right)^{-1}$$

The active region material index of refraction: $n_b = \sqrt{\epsilon_{cav}}$
The in-band kinetic energies:

$$\epsilon_{0h} = \frac{m_\gamma}{m_h}(\hbar\omega_0 - E_g) \text{ and } \epsilon_{0c} = \frac{m_\gamma}{m_e}(\hbar\omega_0 - E_g)$$

The in-band density of states:

$$N_0 = \frac{\delta\omega m_\gamma}{2\hbar}$$

The laser stimulated emission rate coefficient is proportional to the transition dipole integral through the following expression:

$$a = \left(\frac{1}{\hbar}\right)\left(\frac{\omega_0}{\delta\omega}\right)\left(\frac{e^2}{\epsilon_0 \epsilon_{cav}}\right)\langle r\rangle^2 |\Phi(z_{QW})|^2$$

Likewise, the spontaneous emission rate is also dependent on the transition dipole integral:

$$a_{sp} = \alpha_0 \left(\frac{n_b}{c^2}\right)\left(\frac{E_g}{\hbar}\right)^3 \langle r\rangle^2, \text{ where } \alpha_0 = \frac{1}{137}$$

In general, the spontaneous emission coefficient for the complete carrier density (N) is calculated with an integral over the electron and hole populations:

$$B = \left(\frac{2}{\pi}\right) a_{sp} \frac{1}{N^2} \int_0^\infty dk k f(\epsilon_c, \mu_c, T) f(\epsilon_v, \mu_v, T),$$

where the Fermi-function is given by $$f(\epsilon, \mu, T) = \left[\exp\left(\frac{\epsilon - \mu}{k_B T}\right) + 1\right]^{-1}.$$

In our simulation, we are currently using an approximation to this integral.

$$B \approx \frac{2 a_{sp}}{N}\left[1 + \frac{k_B T}{\epsilon_F}\left(e^{-\frac{\epsilon_F}{k_B T}} - 1\right)\right], \text{ where } \overline{\epsilon_F} = \frac{\hbar^2}{m_e + m_h}(2\pi N).$$

The partial electron and hole populations ($n_e$ and $n_h$) experience loss from spontaneous emission that is scaled for the proportion of the populations that interact with the laser cavity mode:

$$B' = 2\frac{a_{sp}}{N_0}$$

There are several parameters within the rate equations that have a dependence on the complete carrier density N and act as dynamic coupling variables. Specifically the Fermi-densities $\overline{n_e} = N_0 f(\epsilon_{0e}, \mu_e, T)$ and $\overline{n_h} = N_0 f(\epsilon_{0h}, \mu_h, T)$ are dependent on the electrochemical potentials $\mu_e = k_B T \ln[\exp(\beta\epsilon_{Fe}) - 1]$ and $\mu_h = k_B T \ln[\exp(\beta\epsilon_{Fh}) - 1]$, which are dependent on the carrier density through the energy levels $$\epsilon_{Fe} = \frac{\hbar^2}{2m_e}(2\pi N) \text{ and } \epsilon_{Fh} = \frac{\hbar^2}{2m_h}(2\pi N).$$

This patent description and drawings are illustrative and are not to be construed as limiting. It is clear that many modifications and variations of this embodiment can be made by one skilled in the art without departing from the spirit of the novel art of this disclosure. While specific parameters, including doping, device configurations, parameters of components, and thresholds may have been disclosed, other reference points can also be used. These modifications and variations do not depart from the broader spirit and scope of the present disclosure, and the examples cited here are illustrative rather than limiting.

What is claimed is:
1. A light emitter comprising:
   a gain structure for providing an optical gain via stimulated emission, the gain structure including a confinement region for charge carriers within a direct-bandgap structure defined by a continuum of charge carrier densities of states along each of a first dimension and a second dimension, the first dimension and the second dimension comprising a planar region of the confinement region, the continuum of charge carrier densities of states adapted for accumulating charge carriers in the direct-bandgap structure, wherein the direct-bandgap structure is configured for producing a stimulated pulsed-light emission comprising a multitude of photons;

an input surface of the light emitter configured to route light to the confinement region where the light undergoes the optical gain via stimulated emission;

an optical emission path of the light emitter that is orthogonal the planar region of the confinement region and that directs light created via stimulated emission in the gain structure through an emission surface of the light emitter; and a plurality of electrodes configured to modify an electric field in a direction orthogonal to the planar region of the confinement region to spatially-redistribute charge carriers within the direct-bandgap structure into at least:
  A) a spatially-accumulating configuration of the charge carriers that does not result in the stimulated pulsed-light emission from the confinement region, and that:
    1. accumulates charge carriers into the continuum of charge carrier densities of states in the direct-bandgap structure, while the direct-bandgap structure is in a direct-bandgap state, in the confinement region; and
    2. distributes the accumulated charge carriers, of both polarities, into portions of the direct-bandgap structure in the confinement region; and
  B) a spatially-overlapping configuration of the accumulated charge carriers for depletion of the accumulated charge carriers that have been accumulated in the spatially-accumulating configuration in the continuum of charge carrier densities of states in the direct-bandgap structure in the confinement region, wherein the spatially-overlapping configuration spatially-distributes the accumulated charge carriers to produce the stimulated pulsed-light emission comprising the multitude of photons from the confinement region.

2. The light emitter of claim 1, wherein the electric field is due in part to a built-in voltage gradient within the gain structure at a zero bias voltage along the confinement dimension.

3. The light emitter of claim 1, wherein the electric field is due in part to a non-zero bias voltage on the electrodes.

4. The light emitter of claim 1, further comprising:
  a pumping source configured to accumulate the charge carriers over a period of time into the spatially-accumulating configuration in the confinement region.

5. The light emitter of claim 4, wherein the pumping source is an optical pumping source of pump light, configured to populate the charge carriers into the spatially-accumulating configuration in the direct bandgap structure by absorption of the pump light by the light emitter.

6. The light emitter of claim 5, wherein the optical pumping source is a pump diode.

7. The light emitter of claim 1, further comprising:
  a carrier injection source for populating the charge carriers in the spatially-accumulating configuration in the confinement region.

8. The light emitter of claim 7, wherein the carrier injection source is a heterojunction.

9. The light emitter of claim 1, wherein the light emitter is part of a laser system including an optical laser cavity.

10. The light emitter of claim 1,
  wherein the optical emission path traverses at least one of the plurality of electrodes for producing the electric field orthogonal to the planar region of the confinement region and, wherein the at least one of the plurality of electrodes is at least partially transmissive.

11. The light emitter of claim 10, wherein the optical emission path traverses at least two electrodes of the plurality of electrodes that are each at least partially transmissive.

12. The light emitter of claim 10, wherein the light emitter is configured with a reflective surface to create a reflected light path including the optical emission path through the at least one of the plurality of electrodes.

13. The light emitter of claim 1, wherein the emission surface of the light emitter and the input surface of the light emitter comprise a single surface of the light emitter.

14. The light emitter of claim 1, wherein the emission surface of the light emitter is a different surface of the light emitter than the input surface of the light emitter.

* * * * *